(12) United States Patent
Jang et al.

(10) Patent No.: US 11,935,990 B2
(45) Date of Patent: Mar. 19, 2024

(54) LIGHT EMITTING DIODE HAVING SIDE REFLECTION LAYER

(71) Applicant: Seoul Viosys Co., Ltd., Ansan-si (KR)

(72) Inventors: Jong Min Jang, Ansan-si (KR); Chae Hon Kim, Ansan-si (KR); Chang Youn Kim, Ansan-si (KR); Jae Hee Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 32 days.

(21) Appl. No.: 17/537,341

(22) Filed: Nov. 29, 2021

(65) Prior Publication Data

US 2022/0085251 A1    Mar. 17, 2022

Related U.S. Application Data

(63) Continuation of application No. 16/789,215, filed on Feb. 12, 2020, now Pat. No. 11,189,755, which is a
(Continued)

(51) Int. Cl.
*H01L 33/36* (2010.01)
*H01L 23/00* (2006.01)
*H01L 33/10* (2010.01)
*H01L 33/32* (2010.01)
*H01L 33/40* (2010.01)
*H01L 33/60* (2010.01)
*H01L 33/00* (2010.01)
(Continued)

(52) U.S. Cl.
CPC ............ *H01L 33/405* (2013.01); *H01L 24/13* (2013.01); *H01L 33/10* (2013.01); *H01L 33/32* (2013.01); *H01L 33/60* (2013.01); *H01L 33/007* (2013.01); *H01L 33/0093* (2020.05); *H01L 33/20* (2013.01); *H01L 33/22* (2013.01); *H01L 33/46* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

2009/0200568 A1    8/2009 Horie
2011/0084301 A1    4/2011 Epler et al.
(Continued)

OTHER PUBLICATIONS

Non-Final Office Action dated Oct. 3, 2019, issued in U.S. Appl. No. 15/811,900.
(Continued)

*Primary Examiner* — Joseph C. Nicely
*Assistant Examiner* — Lamont B Koo
(74) *Attorney, Agent, or Firm* — Oblon, McClelland, Maier & Neustadt, L.L.P.

(57) ABSTRACT

A light emitting diode including a side reflection layer. The light emitting diode includes: a semiconductor stack and a light exit surface having a roughened surface through which light generated from an active layer is emitted; side surfaces defining the light exit surface; and a side reflection layer covering at least part of the side surfaces. The light exit surface is disposed over a first conductivity type semiconductor layer opposite to the ohmic reflection layer, all layers from the active layer to the light exit surface are formed of gallium nitride-based semiconductors, and a distance from the active layer to the light exit surface is 50 μm or more.

20 Claims, 20 Drawing Sheets

Related U.S. Application Data continuation of application No. 15/811,900, filed on Nov. 14, 2017, now Pat. No. 10,749,078.

(60) Provisional application No. 62/461,405, filed on Feb. 21, 2017, provisional application No. 62/422,015, filed on Nov. 14, 2016.

(51) Int. Cl.
  *H01L 33/20* (2010.01)
  *H01L 33/22* (2010.01)
  *H01L 33/46* (2010.01)

(56) References Cited

U.S. PATENT DOCUMENTS

| | | |
|---|---|---|
| 2013/0015483 A1 | 1/2013 | Shimokawa et al. |
| 2013/0277699 A1 | 10/2013 | Liao et al. |
| 2014/0138722 A1 | 5/2014 | Yamada et al. |
| 2014/0353708 A1 | 12/2014 | Seo et al. |
| 2015/0280070 A1 | 10/2015 | Lee et al. |
| 2016/0149099 A1 | 5/2016 | Shatalov et al. |

OTHER PUBLICATIONS

Notice of Allowance dated Apr. 17, 2020, issued in U.S. Appl. No. 15/811,900.
Non-Final Office Action dated Oct. 7, 2020, in U.S. Appl. No. 16/789,215.
Final Office Action dated Mar. 9, 2021, in U.S. Appl. No. 16/789,215.
Notice of Allowance dated Jul. 28, 2021, in U.S. Appl. No. 16/789,215.

LIGHT EMITTING DIODE HAVING SIDE REFLECTION LAYER

CROSS-REFERENCE TO RELATED APPLICATION

This application is a Continuation of U.S. patent application Ser. No. 16/789,215, filed on Feb. 12, 2020, which is a Continuation of U.S. patent application Ser. No. 15/811,900, filed on Nov. 14, 2017, which issued as U.S. Pat. No. 10,749,078, and claims priority from and the benefit of U.S. Provisional Application Nos. 62/422,015, filed on Nov. 14, 2016, and 62/461,405, filed on Feb. 21, 2017, all of which are incorporated by reference for all purposes as if fully set forth herein.

BACKGROUND

Field

Exemplary embodiments of the present disclosure relate to a light emitting diode and, more particularly, a light emitting diode including a side reflection layer to adjust a viewing angle.

Discussion of the Background

Recently, with good thermal stability and a direct transition type energy band structure, Group III-based nitrides such as gallium nitride (GaN), aluminum nitride (AlN), and the like have been spotlighted as materials for light sources in the visible range and the ultraviolet range. Particularly, blue and green light emitting diodes using indium gallium nitride (InGaN) are used in various application fields including large natural color flat displays, signal lamps, interior lighting, high density light sources, camera flash, high resolution output systems, optical communication, and the like. Furthermore, the light emitting diodes exhibit good straight propagation of light and thus, are broadly used in a headlamp for automobiles.

Some applications of light emitting diodes often require the light emitting diodes to have a narrow viewing angle. Particularly, light emitting diodes having a narrower viewing angle are more advantageously applicable to automobile headlamps or camera flashes. In addition, when a backlight light source module configured to spread light through a lens is used as in LED TVs, discharge of light emitted from a side surface of a light emitting diode through the lens is difficult, thereby causing increase in light loss. Therefore, there is a need for a light emitting diode that can reflect light reaching a side surface thereof to allow the light to be emitted within the range of narrow viewing angles.

SUMMARY

Exemplary embodiments of the present disclosure provide a light emitting diode having a narrow viewing angle.

Exemplary embodiments of the present disclosure provide a light emitting diode that has a narrow light viewing angle by reducing the amount of light emitted through a side surface thereof.

Exemplary embodiments of the present disclosure provide a light emitting diode that allows easy control of viewing angle.

Exemplary embodiments of the present disclosure provide a light emitting diode that can realize a narrow viewing angle while reducing deviation in electrical characteristics between light emitting diodes.

In accordance with one aspect of the present disclosure, a light emitting diode includes: a semiconductor stack including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad and a second bump pad disposed under the ohmic reflection layer and electrically connected to the first conductivity type semiconductor layer and the second conductivity type semiconductor layer, respectively; a light exit surface having a roughened surface through which light generated from the active layer is emitted; side surfaces defining the light exit surface; and a side reflection layer covering at least part of the side surfaces. The light exit surface is disposed over the first conductivity type semiconductor layer opposite to the ohmic reflection layer, all layers from the active layer to the light exit surface are formed of gallium nitride-based semiconductors, and a distance from the active layer to the light exit surface is 50 μm or more.

In accordance with another aspect of the present disclosure, a light emitting diode includes: a substrate having a side surface; a semiconductor stack disposed under the substrate and including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad and a second bump pad disposed under the ohmic reflection layer and electrically connected to the first conductivity type semiconductor layer and the second conductivity type semiconductor layer, respectively; and a side reflection layer covering the side surface of the substrate.

In accordance with further aspect of the present disclosure, a light emitting diode includes: a substrate having a side surface; a first conductivity type semiconductor layer disposed under the substrate; a mesa disposed under the first conductivity type semiconductor layer and including an active layer and a second conductivity type semiconductor layer; an ohmic reflection layer covering the second conductivity type semiconductor layer; a lower insulation layer covering the ohmic reflection layer and including a first opening exposing the first conductivity type semiconductor layer and a second opening exposing the ohmic reflection layer; a first pad metal layer disposed on the lower insulation layer and electrically connected to the first conductivity type semiconductor layer through the first opening; a first bump pad electrically connected to the first pad metal layer; a second bump pad electrically connected to the ohmic reflection layer; and a side reflection layer covering the side surface of the substrate. The side reflection layer is spaced apart from the first pad metal layer in a lateral direction so as not to overlap the first pad metal layer.

Exemplary embodiments of the present disclosure provide light emitting diodes that employ a side reflection layer and have a distance of 50 μm from an active layer to a light exit surface, thereby providing a viewing angle of 110 degrees or less. Furthermore, exemplary embodiments of the present disclosure provide light emitting diodes that exhibit good electrical reliability and low deviation in electrical characteristics therebetween by preventing short circuit while maintaining the distance between the side reflection layer and a metal layer.

Exemplary embodiments of the present disclosure provide light emitting diodes that employ a side reflection layer to have a narrow viewing angle by reducing the amount of light emitted through side surfaces thereof and can permit easy adjustment of the viewing angle through adjustment of a location of the side reflection layer. Furthermore, the side reflection layer is formed to be spaced apart from a first pad metal layer in the lateral direction to prevent electric connection between the side reflection layer and the pad metal layer, thereby securing good electrical stability.

Other advantages and effects of the exemplary embodiments of the present disclosure will become apparent from the following detailed description.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1:
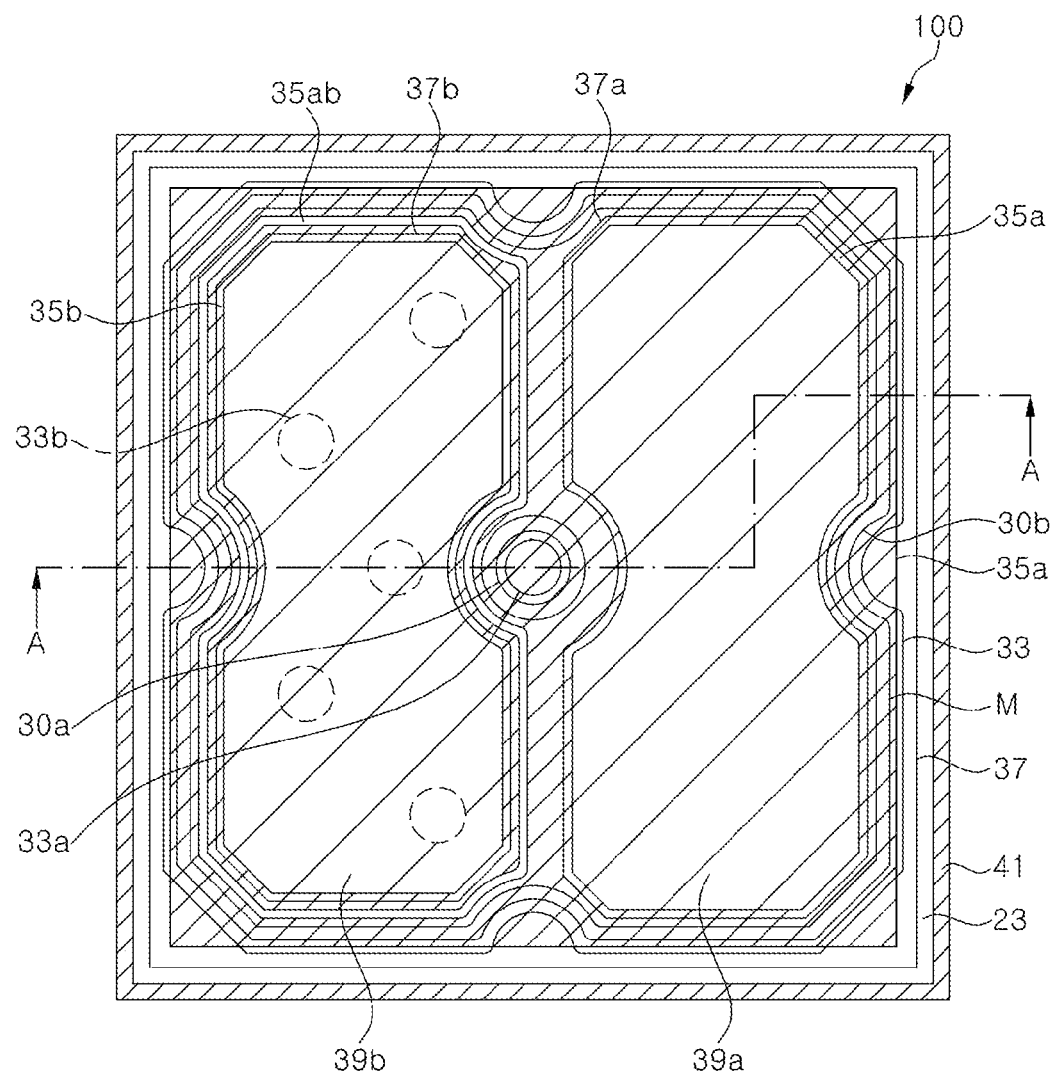
FIG. 1 is a schematic plan view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In accordance with one exemplary embodiment of the present disclosure, a light emitting diode includes: a semiconductor stack including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad and a second bump pad disposed under the ohmic reflection layer and electrically connected to the first conductivity type semiconductor layer and the second conductivity type semiconductor layer, respectively; a light exit surface having a roughened surface through which light generated from the active layer is emitted; side surfaces defining the light exit surface; and a side reflection layer covering at least part of the side surfaces. The light exit surface is disposed over the first conductivity type semiconductor layer opposite to the ohmic reflection layer, all layers from the active layer to the light exit surface are formed of gallium nitride-based semiconductors, and a distance from the active layer to the light exit surface is 50 μm or more.

The side surfaces may include a perpendicular side surface perpendicular to an upper surface of the first conductivity type semiconductor layer and an inclined side surface inclined with respect to the perpendicular side surface, and the perpendicular side surface may be closer to the light exit surface than the inclined side surface.

The inclined side surface may have an inclination angle of about 10 degrees or more with respect to the perpendicular side surface.

The side reflection layer may cover the perpendicular side surface and the inclined side surface.

The light emitting diode may further include a mesa disposed on the first conductivity type semiconductor layer, wherein the mesa includes the active layer and the second conductivity type semiconductor layer. In addition, the mesa may be spaced apart from the side surfaces and the side reflection layer may be disposed only on the side surfaces.

The light emitting diode may further include: a lower insulation layer covering the ohmic reflection layer, the lower insulation layer having a first opening exposing the first conductivity type semiconductor layer and a second opening exposing the ohmic reflection layer; a first pad metal layer disposed on the lower insulation layer and electrically connected to the first conductivity type semiconductor layer through the first opening; a second pad metal layer disposed on the lower insulation layer and electrically connected to the ohmic reflection layer through the second opening; and an upper insulation layer covering the first pad metal layer and the second pad metal layer, the upper insulation layer having a first opening exposing the first pad metal layer and a second opening exposing the second pad metal layer, wherein the first and second bump pads are disposed on the upper insulation layer and electrically connected to the first pad metal layer and the second pad metal layer through the first opening and the second opening of the upper insulation layer, respectively.

The mesa may include a through-hole formed through the second conductivity type semiconductor layer and the active layer to expose the first conductivity type semiconductor layer, and the first pad metal layer may be electrically connected to the first conductivity type semiconductor layer exposed through the through-hole.

The mesa may further include an indented portion formed on side surfaces thereof to expose the first conductivity type semiconductor layer, and the first pad metal layer may be electrically connected to the first conductivity type semiconductor layer exposed through the indented portion.

The mesa may have corners each having a cut shape and the first pad metal layer may be electrically connected to the first conductivity type semiconductor layer near the corners of the mesa.

In some exemplary embodiments, the light emitting diode may further include an ohmic oxide layer disposed on the second conductivity type semiconductor layer around the ohmic reflection layer.

In some exemplary embodiments, the light emitting diode may further include a gallium nitride-based substrate disposed on the first conductivity type semiconductor layer, wherein the light exit surface is formed on the gallium nitride-based substrate and the side reflection layer covers a side surface of the substrate and a side surface of the first conductivity type semiconductor layer.

The light emitting diode may have a light viewing angle of 110 degrees or less.

In accordance with another exemplary embodiment of the present disclosure, a light emitting diode includes: a substrate including a light exit surface having a roughened surface and side surfaces; a first conductivity type semiconductor layer disposed on the substrate; a mesa disposed on the first conductivity type semiconductor layer and including an active layer and a second conductivity type semiconductor layer; an ohmic reflection layer covering the second conductivity type semiconductor layer; a lower insulation layer covering the ohmic reflection layer, the lower insulation layer having a first opening exposing the first conductivity type semiconductor layer and a second opening exposing the ohmic reflection layer; a first pad metal layer disposed on the lower insulation layer and electrically connected to the first conductivity type semiconductor layer through the first opening; a first bump pad electrically connected to the first pad metal layer; a second bump pad electrically connected to the ohmic reflection layer; and a side reflection layer covering the side surfaces of the substrate and a side surface of the second conductivity type semiconductor layer. The side reflection layer is spaced apart from the first pad metal layer in a lateral direction so as not to overlap the first pad metal layer.

The side reflection layer may be disposed only on the side surfaces of the substrate and a side surface of the first conductivity type semiconductor layer. Specifically, the side reflection layer is spaced apart from the mesa and from an exposed surface of the first conductivity type semiconductor layer around the mesa.

The light emitting diode may further include: a second pad metal layer disposed on the lower insulation layer and electrically connected to the ohmic reflection layer through the second opening; and an upper insulation layer covering the first pad metal layer and the second pad metal layer, the upper insulation layer having a first opening exposing the first pad metal layer and a second opening exposing the second pad metal layer, wherein the second bump pad may be connected to the second pad metal layer through the second opening of the upper insulation layer.

In some exemplary embodiments, the side surface of the substrate may include a perpendicular side surface perpendicular to the light exit surface and an inclined side surface inclined with respect to the perpendicular side surface, and the side reflection layer may cover the perpendicular side surface and the inclined side surface.

The side reflection layer on the perpendicular side surface and inclined side surface may have a substantially uniform thickness.

In some exemplary embodiments, the light emitting diode may further include an insulation layer interposed between the inclined side surface and the side reflection layer.

One end of the side reflection layer may be flushed with or may be spaced apart from a surface of the first conductivity type semiconductor layer around the mesa.

In some exemplary embodiments, the mesa may include a through-hole formed through the second conductivity type semiconductor layer and the active layer to expose the first conductivity type semiconductor layer; and an indented portion formed on side surfaces of the mesa and exposing the first conductivity type semiconductor layer, wherein the first pad metal layer is electrically connected to the first conductivity type semiconductor layer exposed to the through-hole and the indented portion.

The first pad metal layer may be electrically connected to the first conductivity type semiconductor layer near corners of the mesa. With this structure, the light emitting diode allow uniform spreading of electric current therein.

The side reflection layer may include a metal reflection layer or a distributed Bragg reflector.

In accordance with another exemplary embodiment of the present disclosure, a light emitting diode includes: a substrate having a side surface; a semiconductor stack disposed under the substrate and including a first conductivity type semiconductor layer, a second conductivity type semiconductor layer, and an active layer interposed between the first conductivity type semiconductor layer and the second conductivity type semiconductor layer; an ohmic reflection layer electrically connected to the second conductivity type semiconductor layer; a first bump pad and a second bump pad disposed under the ohmic reflection layer and electrically connected to the first conductivity type semiconductor layer and the second conductivity type semiconductor layer, respectively; and a side reflection layer covering the side surface of the substrate.

The side reflection layer serves to reduce the light viewing angle of the light emitting diode by reflecting light reaching the side surface of the substrate.

In one exemplary embodiment, the side surface of the substrate includes a perpendicular side surface perpendicular to an upper surface of the first conductivity type semiconductor layer and an inclined side surface inclined with respect to the perpendicular side surface. The side reflection layer may cover at least the perpendicular side surface.

The inclined side surface may have an inclination angle of about 10 degrees or more with respect to the perpendicular side surface.

The perpendicular side surface may be closer to an upper surface of the substrate than the inclined side surface. The side reflection layer may also cover the inclined side surface. The light emitting diode may further include an insulation layer interposed between the inclined side surface and the side reflection layer.

In another exemplary embodiment, the inclined side surface may be closer to an upper surface of the substrate than the perpendicular side surface.

The side reflection layer may cover the inclined side surface. However, it should be understood that other implementations are also possible. Alternatively, the side reflection layer may cover the perpendicular side surface excluding the inclined side surface. The viewing angle of the light emitting diode can be adjusted by changing the location of the side reflection layer.

The side surface of the substrate may be perpendicular to an upper surface of the first conductivity type semiconductor layer.

In one exemplary embodiment, the side reflection layer may cover the entirety of the side surface of the substrate. In another exemplary embodiment, the side reflection layer may cover the side surface of the substrate in a plurality of band shapes spaced apart from each other. Accordingly, the side surface of the substrate may be partially exposed through the side reflection layer and some fraction of light may be emitted through the exposed regions of the side surface of the substrate.

In some exemplary embodiments, the substrate may have a roughened surface formed on the upper surface thereof such that light generated from the active layer can be emitted through the roughened surface. The roughened surface enhances efficiency in extraction of light.

The light emitting diode may include a mesa disposed on the first conductivity type semiconductor layer. The mesa includes the active layer and the second conductivity type semiconductor layer and is spaced apart from the side surfaces. In addition, the side reflection layer may be spaced apart from the mesa in a lateral direction.

The light emitting diode may further include: a lower insulation layer covering the ohmic reflection layer, the lower insulation layer including a first opening exposing the first conductivity type semiconductor layer and a second opening exposing the ohmic reflection layer; a first pad metal layer disposed on the lower insulation layer and electrically connected to the first conductivity type semiconductor layer through the first opening; a second pad metal layer disposed on the lower insulation layer and electrically connected to the ohmic reflection layer through the second opening; and an upper insulation layer covering the first pad metal layer and the second pad metal layer, the upper insulation layer including a first opening exposing the first pad metal layer and a second opening exposing the second pad metal layer. The first and second bump pads are disposed on the upper insulation layer and electrically connected to the first pad metal layer and the second pad metal layer through the first opening and the second opening of the upper insulation layer, respectively.

The mesa may include a through-hole formed through the second conductivity type semiconductor layer and the active layer to expose the first conductivity type semiconductor layer, and the first pad metal layer may be electrically connected to the first conductivity type semiconductor layer exposed through the through-hole.

The mesa may further include an indented portion formed on side surfaces thereof to expose the first conductivity type semiconductor layer, and the first pad metal layer may be electrically connected to the first conductivity type semiconductor layer exposed through the indented portion.

The mesa may have corners each having a cut shape and the first pad metal layer may be electrically connected to the first conductivity type semiconductor layer near the corners of the mesa.

The side reflection layer may include a metal reflection layer. In addition, the substrate may be a sapphire substrate or a gallium nitride-based substrate.

In accordance with further exemplary embodiment of the present disclosure, a light emitting diode includes: a substrate having a side surface; a first conductivity type semiconductor layer disposed under the substrate; a mesa disposed under the first conductivity type semiconductor layer and including an active layer and a second conductivity type semiconductor layer; an ohmic reflection layer covering the second conductivity type semiconductor layer; a lower insulation layer covering the ohmic reflection layer, the lower insulation layer including a first opening exposing the first conductivity type semiconductor layer and a second opening exposing the ohmic reflection layer; a first pad metal layer disposed on the lower insulation layer and electrically connected to the first conductivity type semiconductor layer through the first opening; a first bump pad electrically connected to the first pad metal layer; a second bump pad electrically connected to the ohmic reflection layer; and a side reflection layer covering the side surface of the substrate. The side reflection layer is spaced apart from the first pad metal layer in a lateral direction so as not to overlap the first pad metal layer.

Since the side reflection layer is spaced apart from the first pad metal layer in the lateral direction, the light emitting diode can prevent unnecessary electrical connection therebetween, thereby improving electrical stability of the light emitting diode.

The light emitting diode may further include: a second pad metal layer disposed on the lower insulation layer and electrically connected to the ohmic reflection layer through the second opening; and an upper insulation layer covering the first pad metal layer and the second pad metal layer, the upper insulation layer including a first opening exposing the first pad metal layer and a second opening exposing the second pad metal layer. The second bump pad is connected to the second pad metal layer through the second opening of the upper insulation layer.

The side surface of the substrate may include a perpendicular side surface perpendicular to a light exit surface and an inclined side surface inclined with respect to the perpendicular side surface, and the side reflection layer may cover at least the perpendicular side surface.

The side reflection layer may include a metal reflection layer.

Exemplary embodiments of the present disclosure will be described in more detail with reference to the accompanying drawings.

Figure 2:
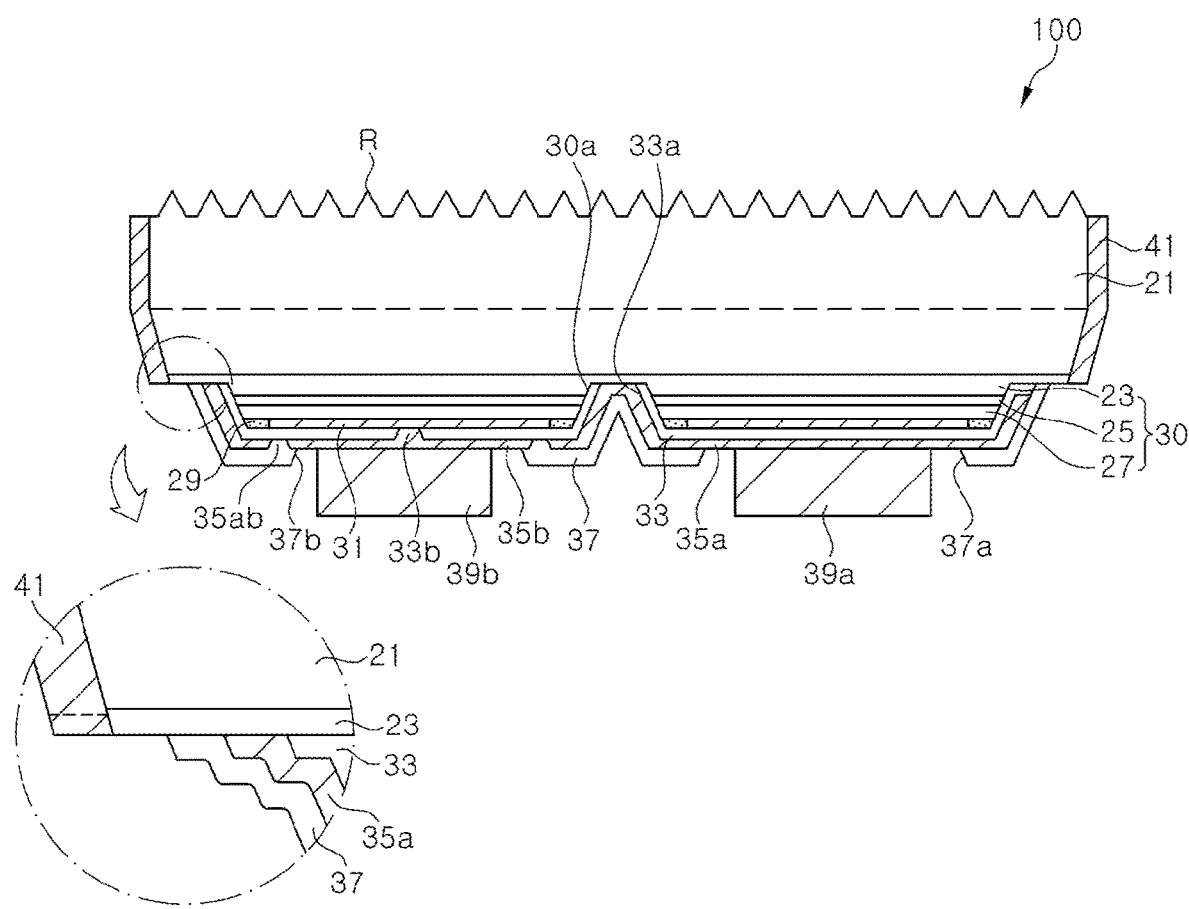
FIG. 2 is a cross-sectional view taken along line A-A of FIG. 1.

FIG. 1 is a schematic plan view of a light emitting diode 100 according to one exemplary embodiment of the present disclosure and FIG. 2 is a cross-sectional view taken along line A-A of FIG. 1.

Referring to FIG. 1 and FIG. 2, the light emitting diode 100 includes a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, an upper insulation layer 37, a first bump pad 39a, a second bump pad 39b, and a side reflection layer 41. The first conductivity type semiconductor layer 23, the active layer 25 and the second conductivity type semiconductor layer 27 constitute a semiconductor stack 30. The light emitting diode may further include a transparent ohmic layer or an ohmic oxide layer 29.

The substrate 21 is a substrate that allows growth of gallium nitride-based semiconductor layers thereon, and may be, for example, a sapphire substrate or a gallium nitride-based substrate. The sapphire substrate may be used in growth of gallium nitride-based semiconductor layers at relatively low cost. The gallium nitride-based substrate has an index of refraction the same as or similar to that of the first conductivity type semiconductor layer 23. Thus, light emitted from the active layer 25 can enter the substrate 21 without suffering from significant variation in refraction, thereby improving luminous efficacy. The substrate 21 has a roughened surface R formed on an upper surface thereof such that light can be emitted through the roughened surface of the substrate. Accordingly, the light emitting diode can have an improved efficiency in the extraction of light.

A light viewing angle of the light emitting diode is decreased with increasing distance from the active layer 23 to the upper surface of the substrate 21. This distance is 50 μm or more, for example, 500 μm or less, specifically 300 μm or less, without being limited thereto. The substrate 21 may have various sizes, without being limited to a particular size.

Although the substrate 21 is a growth substrate in this exemplary embodiment, it should be understood that other implementations are also possible. Alternatively, the substrate may be a relatively thick gallium nitride-based semiconductor layer grown on a separate growth substrate. The separate growth substrate can be removed. Alternatively, a continuous layer of the first conductivity type semiconductor layer 23 may be used instead of the substrate. The separate growth substrate can be removed.

The substrate 21 may include a perpendicular side surface perpendicular to a lower surface of the substrate 21 and an inclined side surface with respect to the perpendicular side surface. An angle defined between the perpendicular side surface and the inclined side surface may be about 10 degrees or more. An inclination angle of the perpendicular side surface may be determined by scribing. Laser scribing provides a steeper inclination angle than blade scribing. A boundary between the perpendicular side surface and the inclined side surface is indicated by a dotted line. The perpendicular side surface and the inclined side surface may be formed on all four side surfaces of the substrate 21.

The first conductivity type semiconductor layer 23 may be disposed on the substrate 21. Particularly, the first conductivity type semiconductor layer 23 is disposed adjacent to the inclined side surface of the substrate 21. The first conductivity type semiconductor layer 23 may be a layer grown on the substrate 21 or a gallium nitride-based semiconductor layer. The first conductivity type semiconductor layer 23 may be a gallium nitride-based semiconductor layer doped with dopants, for example, Si. Here, although the first conductivity type semiconductor layer 23 is illustrated as being clearly differentiated from the substrate 21, the boundary between the first conductivity type semiconductor layer 23 and the substrate 21 may not be so clearly defined. That is, when the first conductivity type semiconductor layer 23 and the substrate 21 are formed of the same material, it can be difficult to clearly distinguish the boundary therebetween. As shown in the drawings, part of the inclined side surface may include the first conductivity type semiconductor layer 23.

A mesa M is disposed on the first conductivity type semiconductor layer 23. The mesa M may be disposed only inside a region surrounded by the first conductivity type semiconductor layer 23 such that regions near edges of the first conductivity type semiconductor layer can be exposed to the outside instead of being covered by the mesa M.

The mesa M may include the second conductivity type semiconductor layer 27 and the active layer 25. In addition, the mesa M may include a portion of the first conductivity type semiconductor layer 23 in a thickness direction thereof. The active layer 25 is interposed between the first conductivity type semiconductor layer 23 and the second conductivity type semiconductor layer 27. The active layer 25 may have a single quantum well structure or a multi-quantum well structure. The composition and thickness of well layers in the active layer 25 determine wavelengths of light generated from the active layer. Particularly, it is possible to provide an active layer generating UV light, blue light, or green light through adjustment of the composition of the well layers.

The second conductivity type semiconductor layer 27 may be a gallium nitride-based semiconductor layer doped with p-type dopants, for example, Mg. Each of the first conductivity type semiconductor layer 23 and the second conductivity type semiconductor layer 27 may be composed of a single layer or multiple layers and may include super lattice layers, without being limited thereto. The first conductivity type semiconductor layer 23, the active layer 25, and the second conductivity type semiconductor layer 27 may be grown on the substrate within a chamber by any well-known method, such as metal organic chemical vapor deposition (MOCVD) or molecular beam epitaxy (MBE).

The mesa M may have an inclined side surface so as to have a gradually narrowing area with increasing distance from the first conductivity type semiconductor layer 23. The mesa M may have a gentler inclination than the inclined side surface of the substrate 21. However, it should be understood that other implementations are also possible. Alternatively, the inclined side surface of the substrate 21 may have a gentler inclination than the side surface of the mesa M.

The mesa M includes a through-hole 30a formed through the second conductivity type semiconductor layer 27 and the active layer 25 to expose the first conductivity type semiconductor layer 23. The through-hole 30a is surrounded by the second conductivity type semiconductor layer 27 and the active layer 25. The mesa M may have a substantially rectangular shape with cut corners. The mesa M may further include an indented portion 30b exposing the first conductivity type semiconductor layer 23. The indented portion 30b is partially surrounded by the second conductivity type semiconductor layer 27 and the active layer 25. The indented portion 30b may be formed on all four side surfaces of the mesa M, without being limited thereto. Alternatively, the indented portion may be restrictively formed on one to three side surfaces of the mesa. Sidewalls of the through-hole 30a and the indented portion 30b may be inclined similar to that of the side surface of the mesa M. The sidewalls of the through-hole and the indented portion may have a gentler inclination than the inclined side surface of the substrate 21.

The ohmic reflection layer 31 is disposed on the mesa M to contact the second conductivity type semiconductor layer 27. The ohmic reflection layer 31 may be disposed over the entire region of an upper surface of the mesa M. For example, the ohmic reflection layer 31 may cover 80% or more, specifically 90% or more, of the upper surface of the mesa M.

The ohmic reflection layer 31 may include a reflective metal layer and thus can reflect light, which is generated in the active layer 25 and reaches the ohmic reflection layer 31, towards the substrate 21. For example, the ohmic reflection layer 31 may be composed of a single reflective metal layer, without being limited thereto. In some exemplary embodiments, the ohmic reflection layer 31 may include an ohmic layer and a reflective layer. The ohmic layer may be a metal layer, such as a Ni layer, and the reflective layer may be a metal layer having high reflectivity, such as an Ag or Al layer. The ohmic reflection layer 31 may further include barrier layers, for example, Ni, Ti, and Au layers. For example, the ohmic reflection layer may have a stack structure of Ni/Ag/Ni/Ti/Ni/Ti/Au/Ti.

The ohmic oxide layer 29 may cover the mesa M around the ohmic reflection layer 31. The ohmic oxide layer 29 may be formed of a transparent oxide layer, for example, indium tin oxide (ITO) or ZnO. A side surface of the ohmic oxide layer 29 may be substantially flush with the side surface of the mesa M. With the ohmic oxide layer 29 disposed around the ohmic reflection layer 31, the light emitting diode can have an enlarged ohmic contact area, thereby reducing forward voltage of the light emitting diode.

The lower insulation layer 33 covers the mesa M, the ohmic oxide layer 29, and the ohmic reflection layer 31. The lower insulation layer 33 may cover the side surface of the mesa M along the periphery of the mesa M, and may also cover a portion of the first conductivity type semiconductor layer 23 exposed along the periphery of the mesa M. The lower insulation layer 33 covers the sidewall of the through-hole 30a inside the through-hole 30a and also covers the sidewall of the indented portion 30b.

The lower insulation layer 33 has a first opening 33a which exposes the first conductivity type semiconductor layer 23, and a second opening 33b which exposes the ohmic reflection layer 31. The first opening 33a may be disposed in each of the through-hole 30a and the indented portion 30b. In addition, the lower insulation layer 33 may expose the first conductivity type semiconductor layer 23 along the periphery of the mesa M.

The second opening 33b of the lower insulation layer 33 exposes the ohmic reflection layer 31. The lower insulation layer 33 may include a plurality of second openings 33b, which may be disposed near one side of the mesa M.

The lower insulation layer 33 may be composed of a single layer of $SiO_2$ or $Si_3N_4$, without being limited thereto. Alternatively, the lower insulation layer 33 may have a multilayer structure including, for example, a silicon nitride layer and a silicon oxide layer, or may include a distributed Bragg reflector in which dielectric layers having different indexes of refraction such as a silicon oxide layer and a titanium oxide layer are alternately stacked one above another.

The first pad metal layer 35a is disposed on the lower insulation layer 33 and is insulated from the mesa M and the ohmic reflection layer 31 by the lower insulation layer 33. The first pad metal layer 35a contacts the first conductivity type semiconductor layer 23 through the first openings 33a of the lower insulation layer 33. The first pad metal layer 35a may include an outer contact portion contacting the first conductivity type semiconductor layer 23 around the mesa M and an inner contact portion contacting the first conductivity type semiconductor layer 23 inside the through-hole 30a. The outer contact portion of the first pad metal layer 35a may be formed near the indented portion 30b formed on the periphery of the mesa M and may also be formed near four corners of the mesa M. At least one of the inner and outer contact portions may be used and use of both the inner contact portion and the outer contact portion can enhance current spreading performance of the light emitting diode.

The second pad metal layer 35b is disposed on the lower insulation layer 33 to be placed above the mesa M and is electrically connected to the ohmic reflection layer 31 through the second openings 33b of the lower insulation layer 33. The second pad metal layer 35b may be surrounded by the first pad metal layer 35a and a boundary region 35ab may be formed therebetween. The lower insulation layer 33 is exposed to the boundary region 35ab, which is covered by the upper insulation layer 37 described below.

The first pad metal layer 35a and the second pad metal layer 35b may be formed of the same material by the same process. Each of the first and second pad metal layers 35a, 35b may include an ohmic reflection layer, such as an Al layer, which may be formed on a bonding layer such as a Ti, Cr or Ni layer. In addition, a protective layer composed of a single layer or composite layer including Ni, Cr, Au and the like may be formed on the ohmic reflection layer. The first and second pad metal layers 35a, 35b may have a multilayer structure of, for example, Cr/Al/Ni/Ti/Ni/Ti/Au/Ti.

The upper insulation layer 37 covers the first and second pad metal layers 35a, 35b. In addition, the upper insulation layer 37 may cover the first conductivity type semiconductor layer 23 along the periphery of the mesa M. Here, the upper insulation layer 37 may expose the first conductivity type semiconductor layer 23 along an edge of the substrate 21.

The upper insulation layer 37 includes a first opening 37a which exposes the first pad metal layer 35a and a second opening 37b which exposes the second pad metal layer 35b. The first opening 37a and the second opening 37b may be disposed above the mesa M so as to face each other. Particularly, the second opening 37b may be disposed only in an upper region of the second pad metal layer 35b.

Although the second opening 37b is illustrated as completely exposing upper regions of the second openings 33b of the lower insulation layer 33 in this exemplary embodiment, the second opening 37b of the upper insulation layer may be spaced apart from the second openings 33b of the lower insulation layer 33 in the lateral direction. That is, the second openings 33b may be disposed outside the second opening 37b and a plurality of second openings 37b may be spaced apart from the second openings 33b in the lateral direction.

The upper insulation layer 37 may be composed of a single layer of $SiO_2$ or $Si_3N_4$, without being limited thereto. Alternatively, the upper insulation layer 37 may have a multilayer structure including, for example, a silicon nitride layer and a silicon oxide layer, or may include a distributed Bragg reflector in which dielectric layers having different indexes of refraction such as a silicon oxide layer and a titanium oxide layer are alternately stacked one above another.

The first bump pad 39a electrically contacts the first pad metal layer 35a exposed through the first opening 37a of the upper insulation layer 37, and the second bump pad 39b electrically contacts the second pad metal layer 35b exposed through the second opening 37b. As shown in FIG. 1 and FIG. 2, the first bump pad 39a and the second bump pad 39b may be disposed only in the first opening 37a and the second opening 37b, respectively, without being limited thereto. Alternatively, the first and second bump pads 39a, 39b may cover the first and second openings 37a, 37b to seal the first and second openings 37a, 37b, respectively.

The first bump pad 39a is electrically connected to the first conductivity type semiconductor layer 23 through the first pad metal layer 35a, and the second bump pad 39b is electrically connected to the second conductivity type semiconductor layer 27 through the second pad metal layer 35b and the ohmic reflection layer 31. The second pad metal layer 35b may be omitted and the second bump pad 39b may be directly connected to the ohmic reflection layer 31.

As shown in FIG. 1, the second bump pad 39b may be placed only in an upper region of the second pad metal layer 35a, without being limited thereto. Alternatively, the second bump pad 39b may partially overlap the first pad metal layer 35a. In this exemplary embodiment, the upper insulation layer 37 is disposed between the first pad metal layer 35a and the second bump pad 39b to insulate the first pad metal layer 35a from the second bump pad 39b.

On the other hand, the side reflection layer 41 may be disposed on the side surfaces of the substrate 21. The side reflection layer 41 covers not only the perpendicular side surface of the substrate 21 but also the inclined side surface thereof. The side reflection layer 41 may also cover the side surface of the first conductivity type semiconductor layer 23.

Although the side reflection layer 41 may be formed to cover all four side surfaces of the substrate 21, other implementations are also possible. Alternatively, the side reflection layer 41 may be formed to cover one to three side surfaces of the substrate 21.

The side reflection layer 41 is spaced apart from the mesa M in the lateral direction. As shown in an enlarged circle of FIG. 2, the side reflection layer 41 is spaced apart from the first pad metal layer 35a in the lateral direction. Particularly, the side reflection layer 41 may be disposed above the upper surface of the mesa M and thus is placed above the exposed surface of the first conductivity type semiconductor layer 23 around the mesa M. For example, a lower end of the side reflection layer 41 may be flush with the exposed surface of the first conductivity type semiconductor layer 23 and may be placed above the exposed surface of the first conductivity type semiconductor layer 23, as indicated by a dotted line. Accordingly, a portion of the exposed surface of the first conductivity type semiconductor layer 23 around the mesa M may be exposed to the outside between the side reflection layer 41 and the upper insulation layer 37.

The side reflection layer 41 may include a metal reflection layer of Ag or Al and a barrier layer such as Ni and/or Ti may be disposed on the metal reflection layer. Further, an anti-oxidation layer such as an Au layer may be disposed on the barrier layer in order to prevent oxidation of the metal reflection layer. Furthermore, a bonding layer such as a Ni layer or a Ti layer may be interposed between the metal reflection layer and the substrate 21 in order to improve bonding characteristics of the metal reflection layer. The side reflection layer 41 may form ohmic contact or Schottky contact with the substrate 21 and the first conductivity type semiconductor layer 23.

The side reflection layer 41 may include a distributed Bragg reflector instead of the metal reflection layer or may further include an omnidirectional reflector (ODR) including a transparent oxide layer between the metal reflection layer and the substrate 21.

With the side reflection layer 41 disposed only on the side surfaces of the substrate 21 and the first conductivity type semiconductor layer 23, the side reflection layer 41 can be prevented from directly contacting (and short circuiting) the first pad metal layer 35a, thereby preventing electrical interference by the side reflection layer 41.

When the side reflection layer 41 includes the metal reflection layer overlapping the first pad metal layer 35a, the side reflection layer 41 can be directly electrically connected to the first pad metal layer 35a through various defects, such as pin holes or cracks in the upper insulation layer 37. In this case, electrical characteristics of the light emitting diode, such as forward voltage, can be significantly changed depending upon the presence of contact between the side reflection layer 41 and the first pad metal layer 35a, thereby causing significant variation in electrical characteristics between light emitting diodes. On the contrary, according to this exemplary embodiment, the side reflection layer 41 is spaced apart from the first pad metal layer 35a, thereby enabling mass production of light emitting diodes with less deviation in electrical characteristics.

Figure 3:
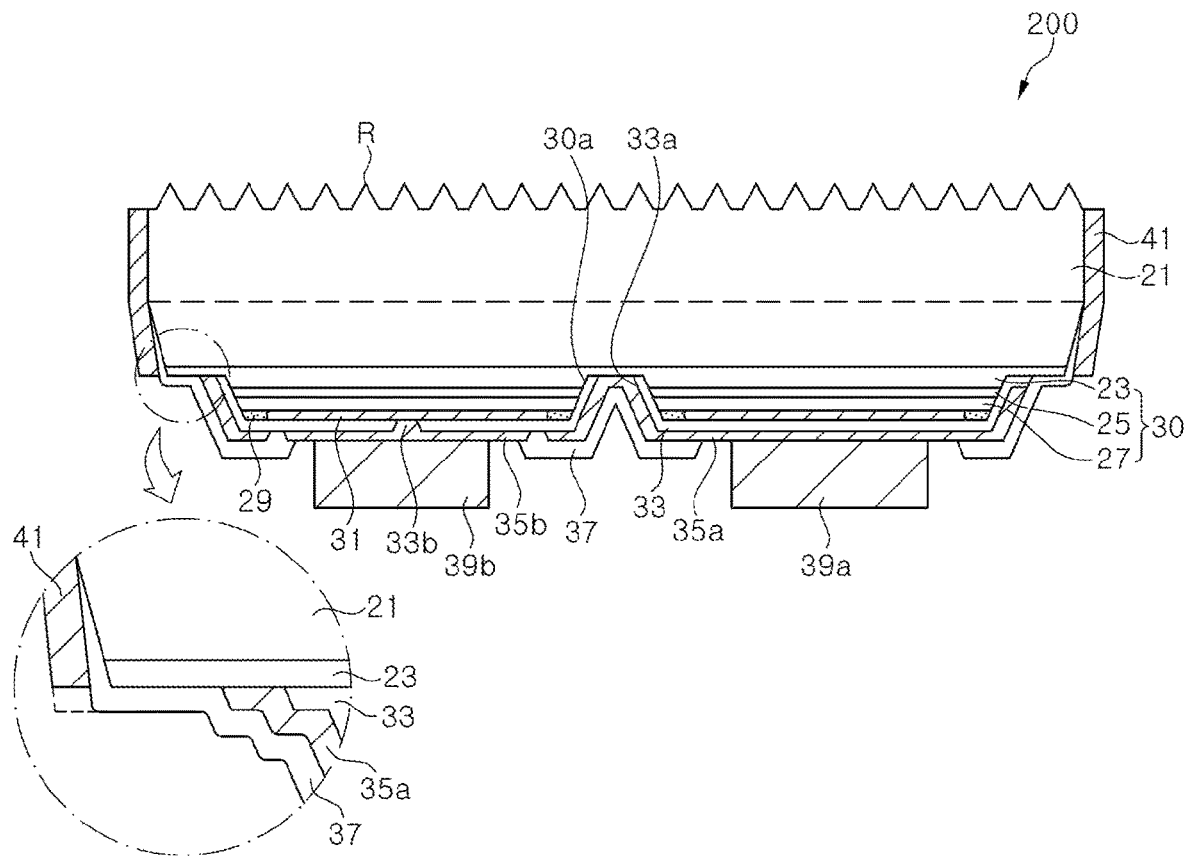
FIG. 3 is a schematic cross-sectional view of a light emitting diode according to another exemplary embodiment of the present disclosure.

FIG. 3 is a schematic cross-sectional view of a light emitting diode 200 according to another exemplary embodiment of the present disclosure.

Referring to FIG. 3, the light emitting diode 200 according to this exemplary embodiment is generally similar to the light emitting diode 100 described with reference to FIG. 1 and FIG. 2 except that the upper insulation layer 37 covers the inclined side surface of the substrate 21.

That is, the upper insulation layer 37 covers the entirety of the first conductivity type semiconductor layer 23 exposed around the mesa M, and also covers the side surface of the first conductivity type semiconductor layer 23 and the inclined side surface of the substrate 21. Here, the upper insulation layer 37 does not cover the perpendicular side surface of the substrate 21.

On the other hand, the side reflection layer 41 covers the perpendicular side surface of the substrate 21 and also covers the upper insulation layer 37 on the inclined side surface. In this structure, the lower end of the side reflection layer 41 may be flush with the exposed surface of the first conductivity type semiconductor layer 23 or may be disposed below the exposed surface of the first conductivity type semiconductor layer 23, as indicated by a dotted line. Here, the lower end of the side reflection layer 41 may be coplanar with or disposed above a horizontal plane of the upper insulation layer 37.

When the inclined side surface is formed by a scribing process, the inclined side surface can become a rough surface. In this case, the side reflection layer 41 cannot be deposited on the inclined side surface or may be easily removed therefrom even if the side reflection layer can be deposited thereon. Thus, the upper insulation layer 37 is formed to cover the inclined side surface so as to allow stable formation of the side reflection layer 41.

Figure 4:
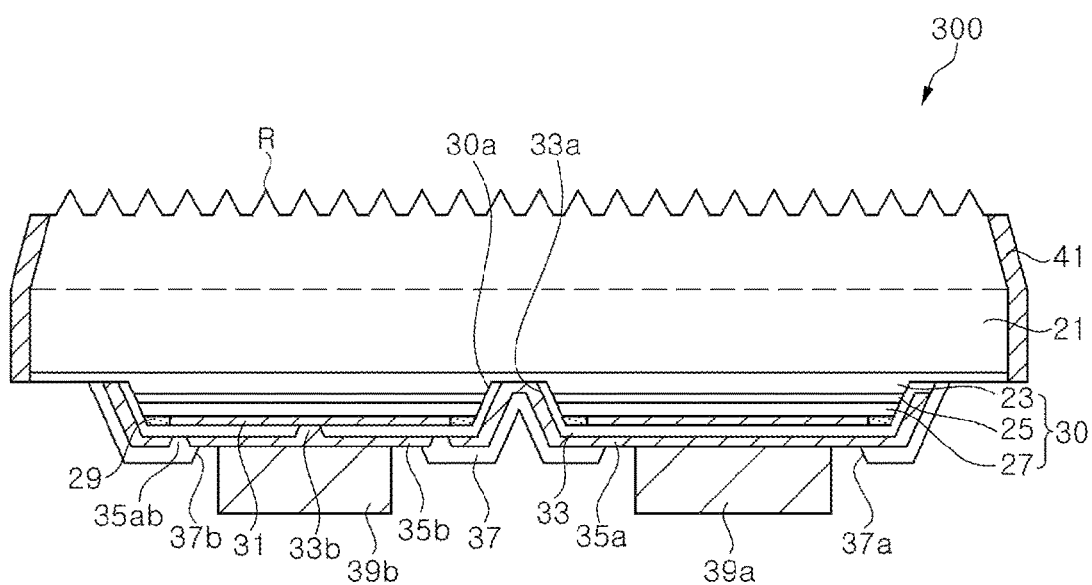
FIG. 4 is a schematic cross-sectional view of a light emitting diode according to a further exemplary embodiment of the present disclosure.

FIG. 4 is a schematic cross-sectional view of a light emitting diode 300 according to another exemplary embodiment of the present disclosure.

Referring to FIG. 4, the light emitting diode 300 according to this exemplary embodiment is generally similar to the light emitting diode 100 described with reference to FIG. 1 and FIG. 2 except that the inclined side surface of the light emitting diode 300 is placed closer to the upper surface of the substrate than the perpendicular side surface thereof. The inclined side surface of the substrate may be placed adjacent the upper surface of the substrate 21, and the perpendicular side surface thereof may be placed adjacent the first conductivity type semiconductor layer 23. The perpendicular side surface and the inclined side surface may be covered by the side reflection layer 41.

Since the inclined side surface is placed adjacent the upper surface of the substrate 21, the light emitting diode 300 according to this exemplary embodiment may have a narrower viewing angle than the light emitting diode 100 shown in FIG. 1 and FIG. 2.

Figure 5:
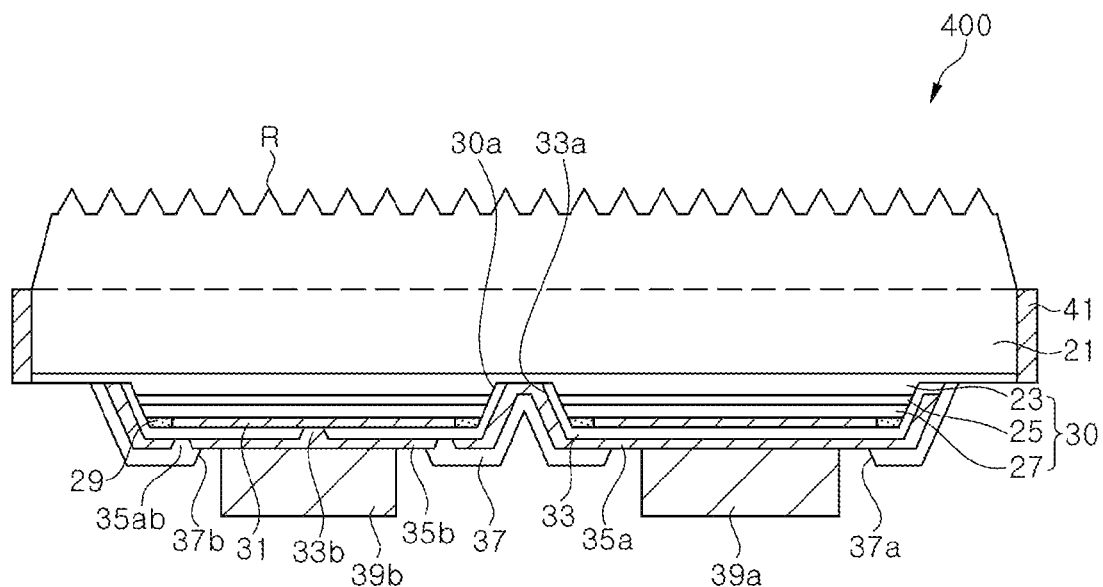
FIG. 5 is a schematic cross-sectional view of a light emitting diode according to yet another exemplary embodiment of the present disclosure.

FIG. 5 is a schematic cross-sectional view of a light emitting diode 400 according to yet another exemplary embodiment of the present disclosure.

Referring to FIG. 5, the light emitting diode 400 according to this exemplary embodiment is generally similar to the light emitting diode 300 described with reference to FIG. 4 except that the side reflection layer 41 does not cover the inclined side surface of the substrate. That is, the side reflection layer 41 covers the perpendicular side surface of the substrate 21 excluding the inclined side surface thereof.

With this structure, the light emitting diode 400 may have a wider viewing angle than the light emitting diode 300 and the light emitting diode 100.

As in this exemplary embodiment, the viewing angle of the light emitting diode can be controlled by adjusting the location of the side reflection layer 41 on the light emitting diode.

Figure 6:
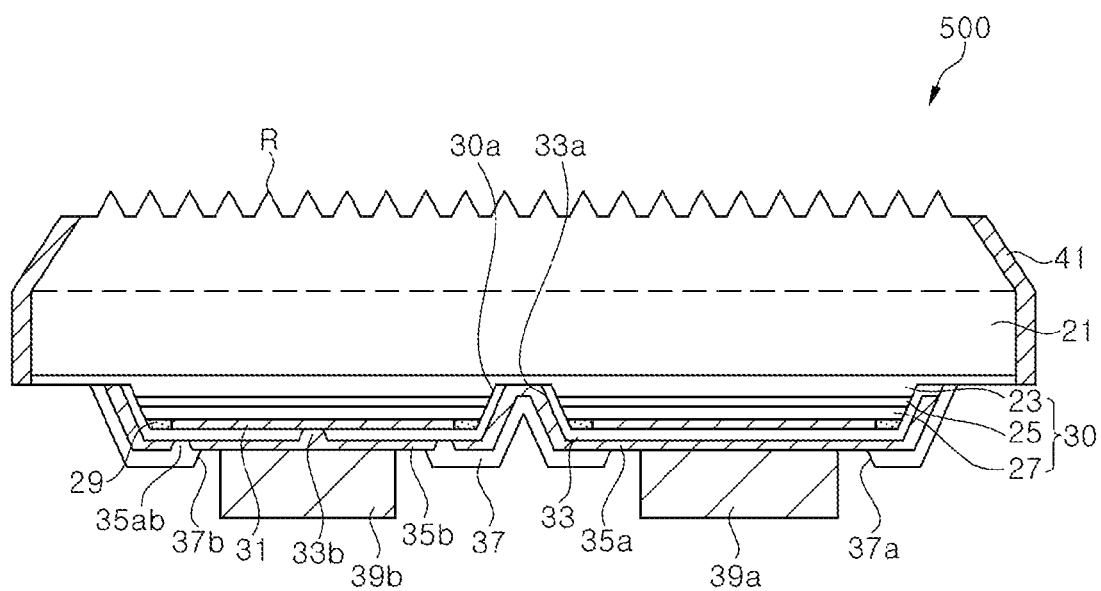
FIG. 6 is a schematic cross-sectional view of a light emitting diode according to yet another exemplary embodiment of the present disclosure.

FIG. 6 is a schematic cross-sectional view of a light emitting diode 500 according to yet another exemplary embodiment of the present disclosure.

Referring to FIG. 6, the light emitting diode 500 according to this exemplary embodiment is generally similar to the light emitting diode 400 described with reference to FIG. 5 except that the inclined side surface has a gentler inclination.

As shown in FIG. 5, the inclined side surface may be formed to have an inclination angle of about 10 to 20 degrees, particularly 10 to 15 degrees, with respect to the perpendicular side surface. In this exemplary embodiment, the inclined side surface may be formed to have an inclination angle of about 20 to 60 degrees, for example, 30 to 50 degrees, with respect to the perpendicular side surface.

The inclination angle of the inclined side surface can be adjusted to control the viewing angle of the light emitting diode while improving light extraction efficiency thereof.

Figure 7:
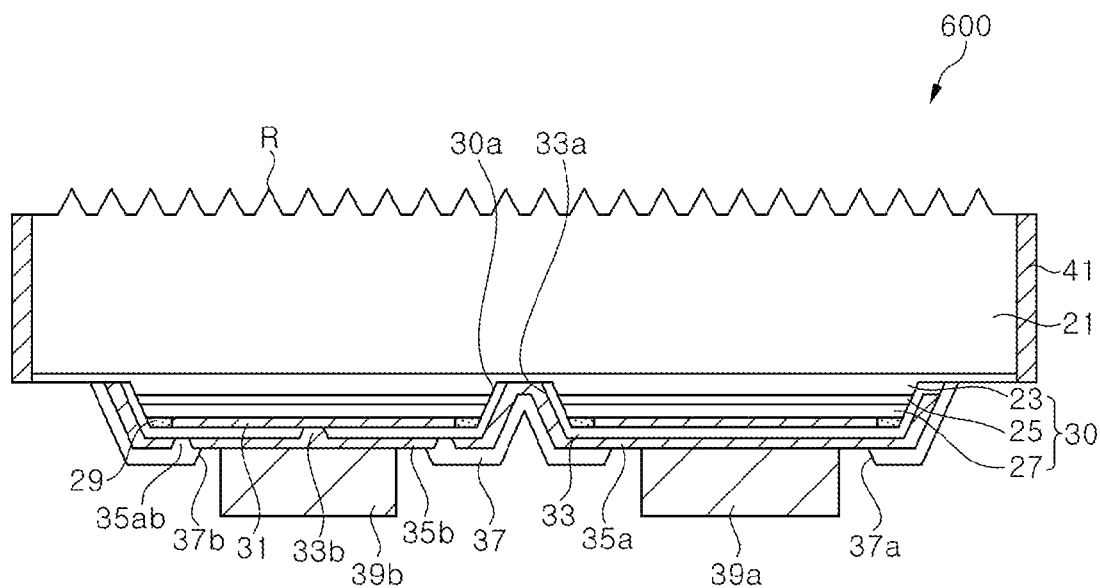
FIG. 7 is a schematic cross-sectional view of a light emitting diode according to yet another exemplary embodiment of the present disclosure.

FIG. 7 is a schematic cross-sectional view of a light emitting diode 600 according to yet another exemplary embodiment of the present disclosure.

Referring to FIG. 7, the light emitting diode 600 according to this exemplary embodiment is generally similar to the light emitting diode 100 described with reference to FIG. 1 and FIG. 2 except that the substrate 21 includes only the perpendicular side surface without the inclined side surface.

That is, the substrate 21 of the light emitting diode 600 according to this exemplary embodiment includes the perpendicular side surface. The side surface of the first conductivity type semiconductor layer 23 may also be flush with the perpendicular side surface of the substrate 21.

The side reflection layer 41 covers the perpendicular side surface of the substrate 21.

Figure 8:
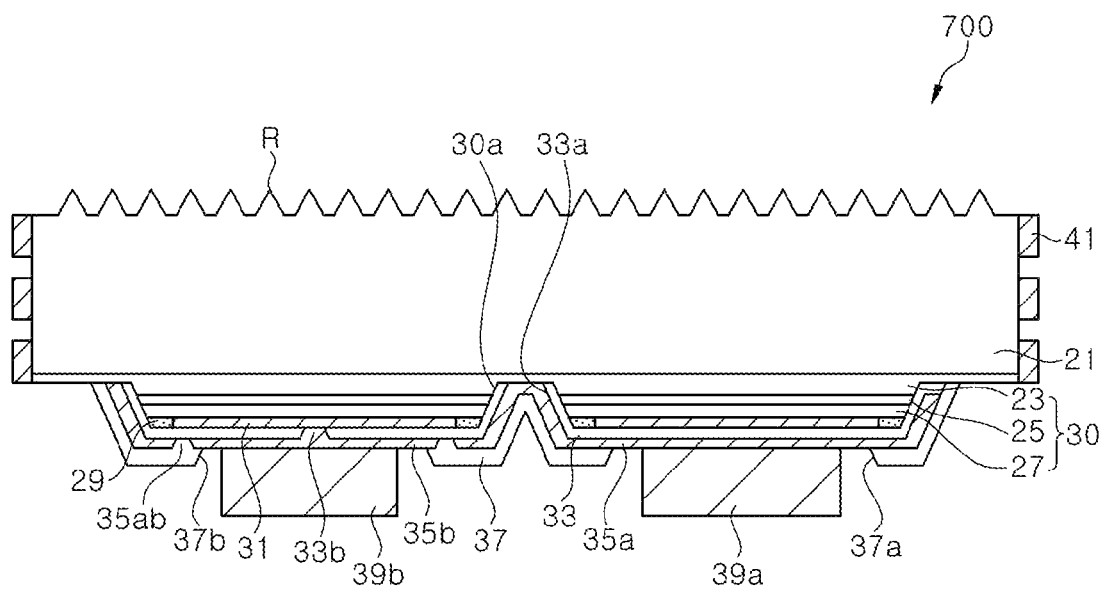
FIG. 8 is a schematic cross-sectional view of a light emitting diode according to yet another exemplary embodiment of the present disclosure.

FIG. 8 is a schematic cross-sectional view of a light emitting diode 700 according to yet another exemplary embodiment of the present disclosure.

Referring to FIG. 8, the light emitting diode 700 according to this exemplary embodiment is generally similar to the light emitting diode 600 described with reference to FIG. 7 except that the side reflection layer 41 is formed in a plurality of band shapes covering the side surface of the substrate 21. The side surface of the substrate 21 is exposed through gaps between the bands of the side reflection layer 41.

The substrate 21 may have a rectangular shape, as shown in FIG. 1, and the side reflection layer 21 may be formed in the band shape on each side surface of the substrate 21. A band formed on one side surface of the substrate 21 may be connected to bands formed on other side surfaces thereof to form a loop formed along the side surfaces thereof. Alternatively, the bands may be discontinuously formed on the side surfaces of the substrate 21.

Light can be emitted through exposed regions of the side surfaces of the substrate 21, thereby increasing the viewing angle of the light emitting diode 600 shown in FIG. 7.

FIG. 9A to FIG. 17D are schematic plan views and cross-sectional views illustrating a method of manufacturing a light emitting diode according to one exemplary embodiment of the present disclosure. FIGS. 9A, 10A, 11A, 12A, 13A, 14A, 15A and 16A are plan views and FIGS. 9B, 10B, 11B, 12B, 13B, 14B, 15B and 16B are cross-sectional views taken along line A-A thereof.

Figure 9A:
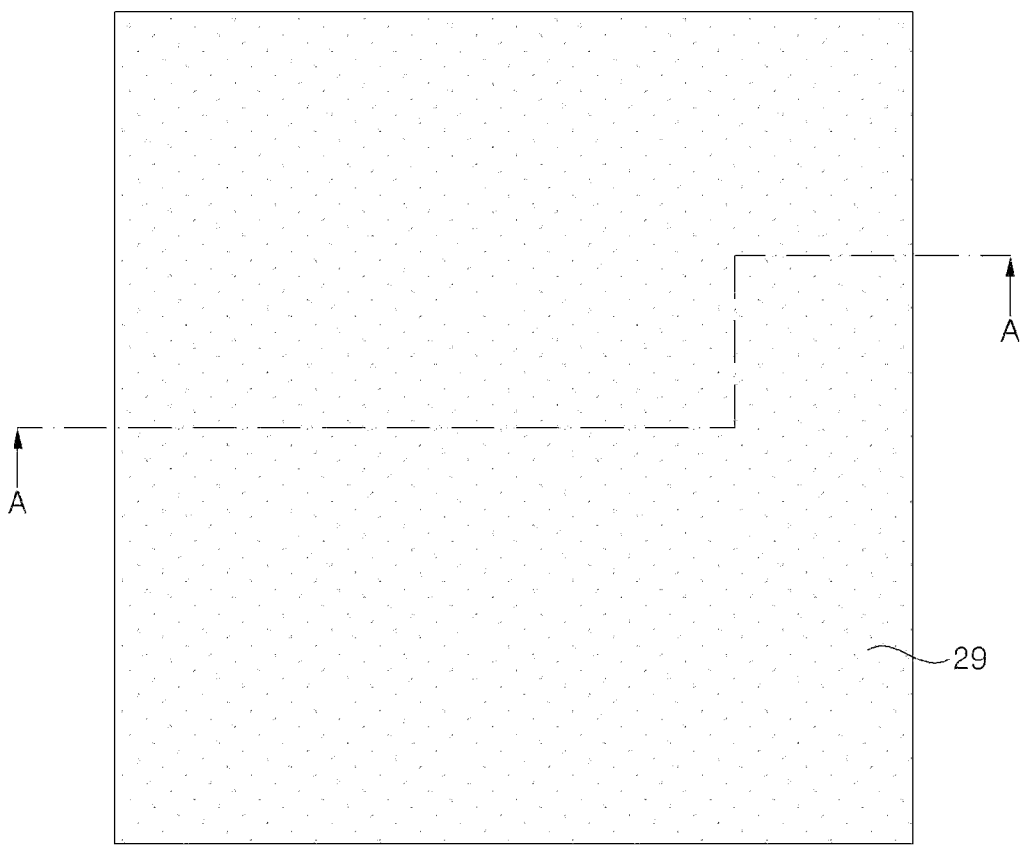
FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 17C and FIG. 17D are schematic plan views and cross-sectional views illustrating a method of manufacturing a light emitting diode according to one exemplary embodiment of the present disclosure.
Figure 9B:
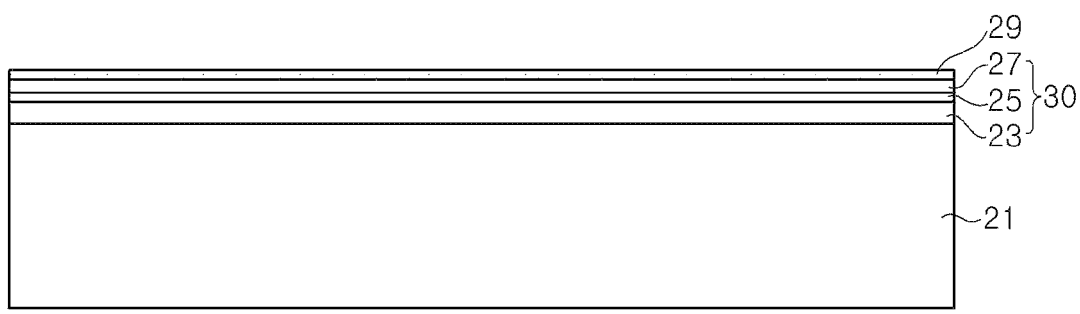

Referring to FIG. 9A and FIG. 9B, a semiconductor stack 30 including a first conductivity type semiconductor layer 23, an active layer 25 and a second conductivity type semiconductor layer 27 are grown on a substrate 21 and an ohmic oxide layer 29 is formed on the semiconductor stack 30.

The substrate 21 may be a sapphire substrate or a gallium nitride-based substrate. The gallium nitride-based semiconductor layer may have an n-type dopant concentration of, for example, $7E17/cm^3$ to $9E17/cm^3$. The first conductivity type semiconductor layer 23 may have an n-type dopant concentration of, for example, $9E18/cm^3$ to $2E19/cm^3$.

The first conductivity type semiconductor layer 23, the active layer 25 and the second conductivity type semiconductor layer 27 may be grown on the substrate 21 within a chamber by any well-known method, such as metal organic chemical vapor deposition (MOCVD) or molecular beam epitaxy (MBE).

The ohmic oxide layer 29 may be formed of, for example, ITO or ZnO. The ohmic oxide layer 29 may be formed by e-beam evaporation or sputtering and may cover the second conductivity type semiconductor layer 27 to form ohmic contact with the second conductivity type semiconductor layer 27.

Figure 10A:
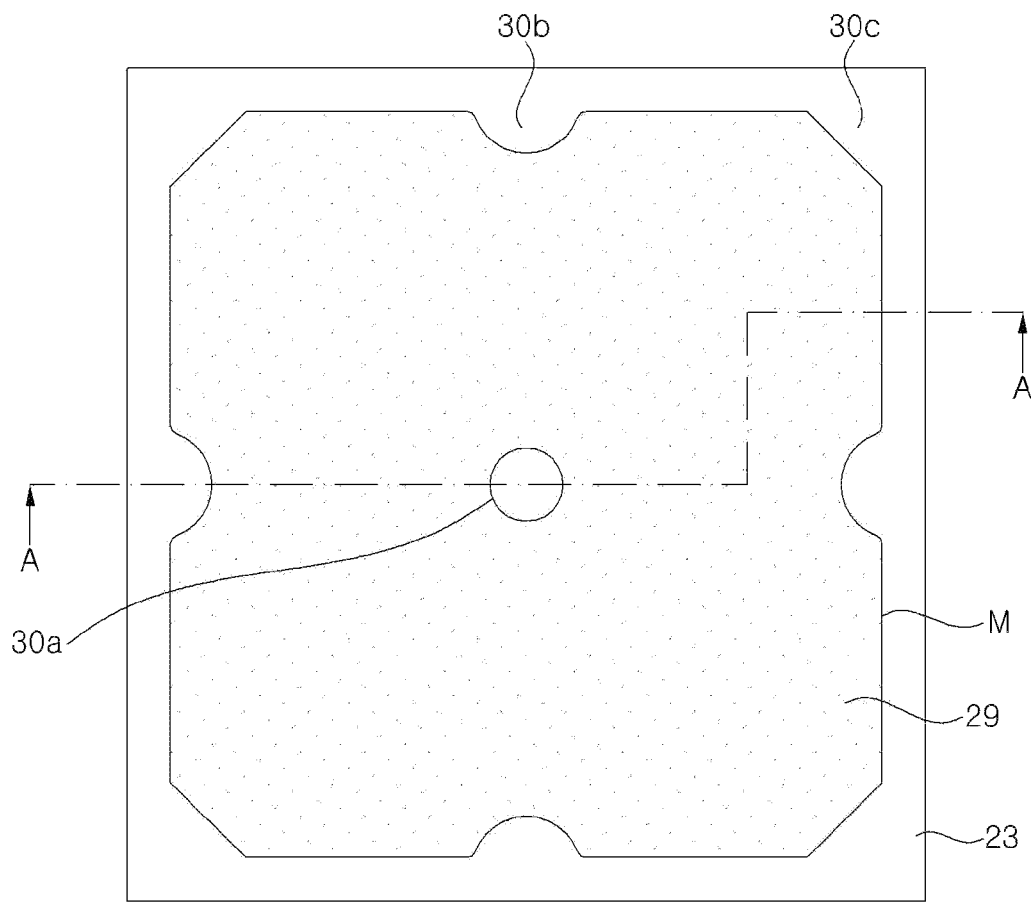
Figure 10B:
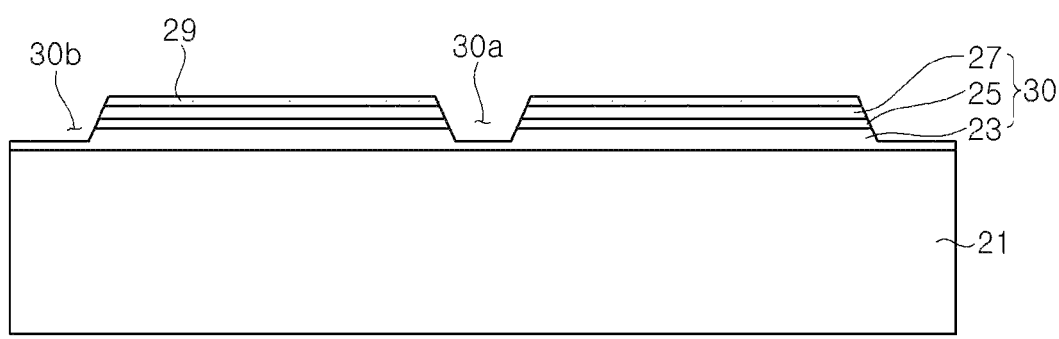

Referring to FIG. 10A and FIG. 10B, a mesa M is formed by patterning the ohmic oxide layer 29 and the semiconductor stack 30. By forming the mesa M, the first conductivity type semiconductor layer 23 is exposed around the mesa M. The mesa M has a through-hole 30a and an indented portion 30b and may be formed to have partially cut corners. The ohmic oxide layer 29 covers substantially the entire upper region of the mesa M and has the same shape as the mesa M in plan view.

In this exemplary embodiment, the ohmic oxide layer 29 may be subjected to patterning by wet etching using a photoresist pattern, and the semiconductor stack 30 may be subjected to patterning by dry etching. However, it should be understood that other implementations are also possible and both the ohmic oxide layer 29 and the semiconductor stack 30 may be subjected to patterning through dry etching. On the other hand, patterning of the ohmic oxide layer 29 and the semiconductor stack 30 may be performed using the same photoresist pattern.

Figure 11A:
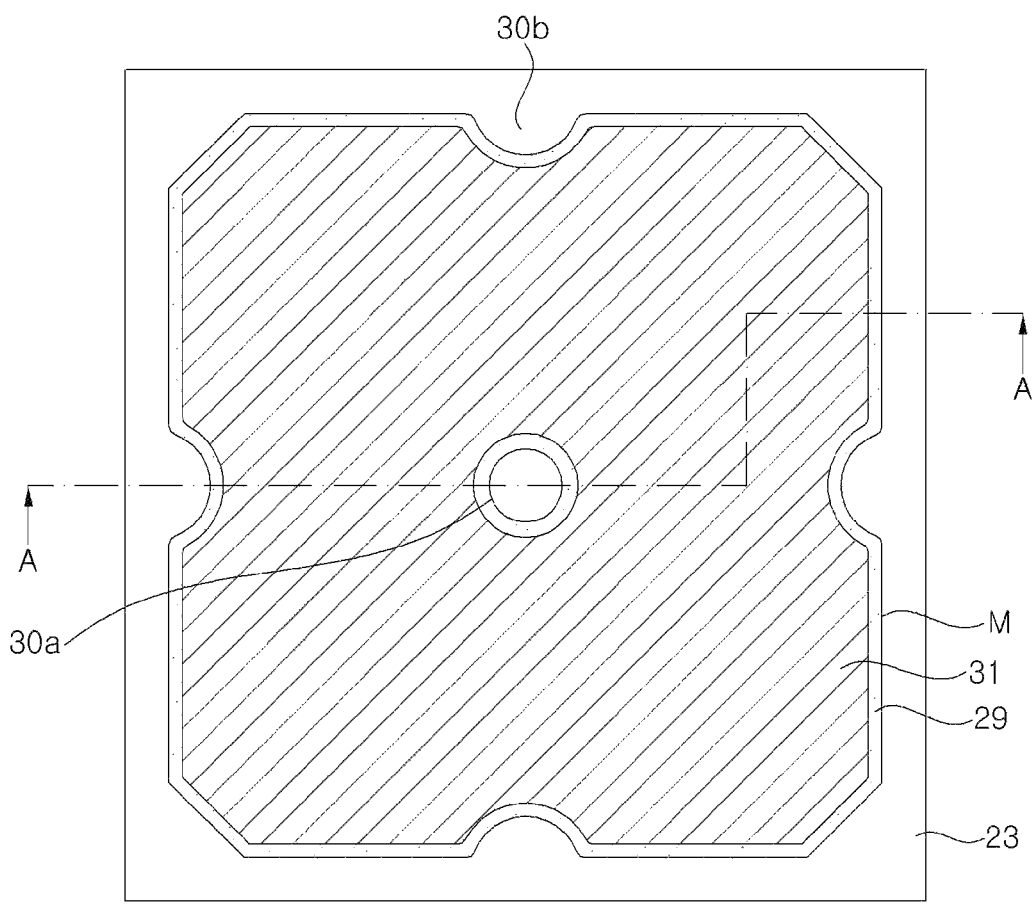
Figure 11B:
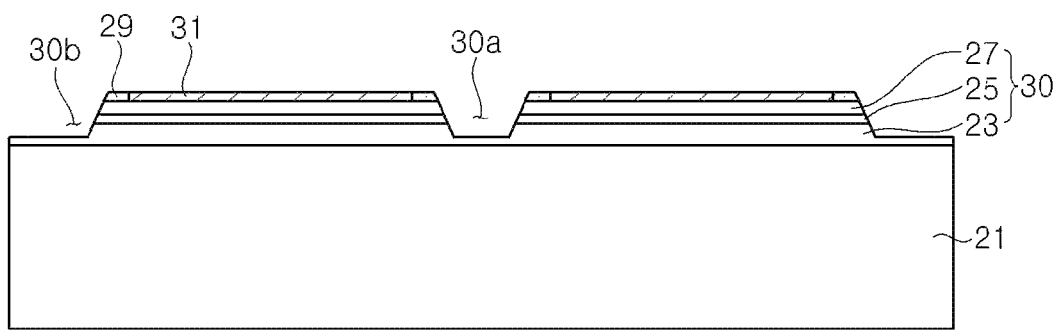

Referring to FIG. 11A and FIG. 11B, the second conductivity type semiconductor layer 27 is exposed by patterning the ohmic oxide layer 29 and an ohmic reflection layer 31 is formed on an exposed region of the second conductivity type semiconductor layer 27. The ohmic reflection layer 31 includes a metal reflection layer, such as an Ag or Al layer, and may further include an ohmic metal layer, such as a Ni layer. Materials for the ohmic reflection layer 31 are described above with reference to FIG. 1 and FIG. 2 and detailed description thereof will be omitted for clarity. The ohmic reflection layer 31 may be formed by e-beam evaporation or sputtering.

Figure 12A:
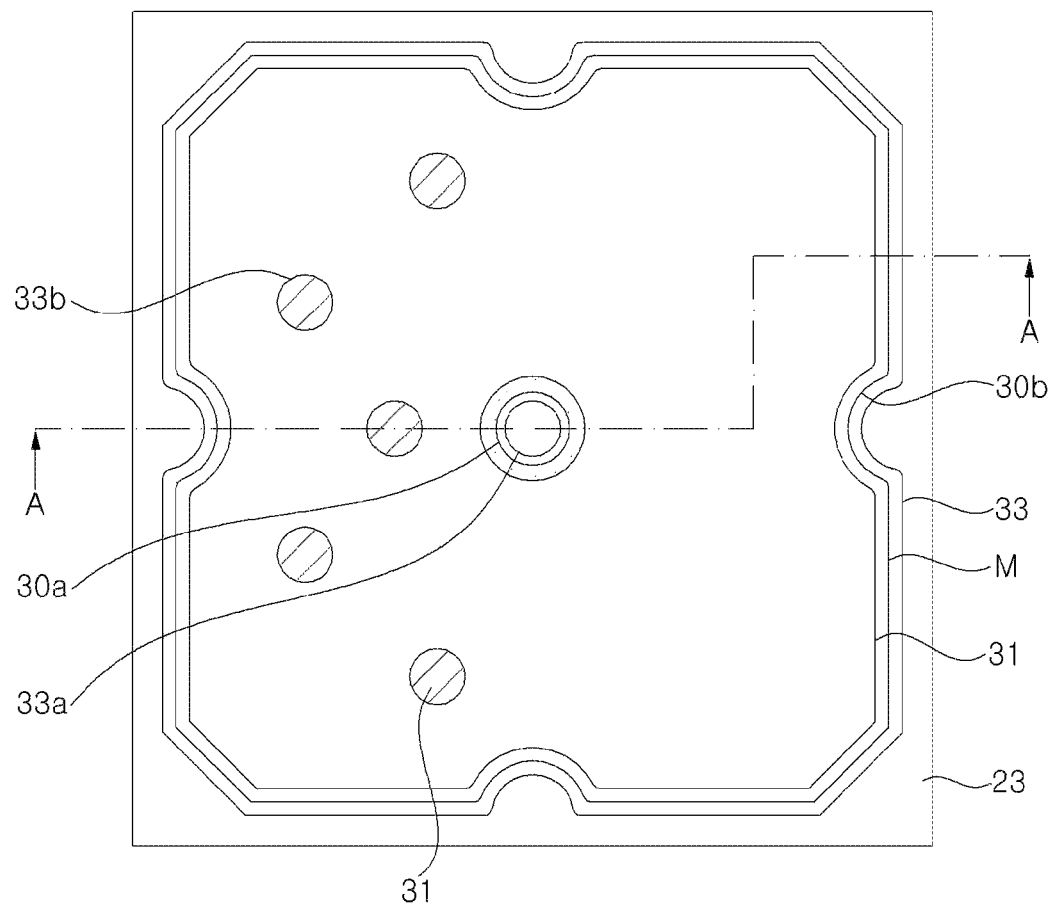
Figure 12B:
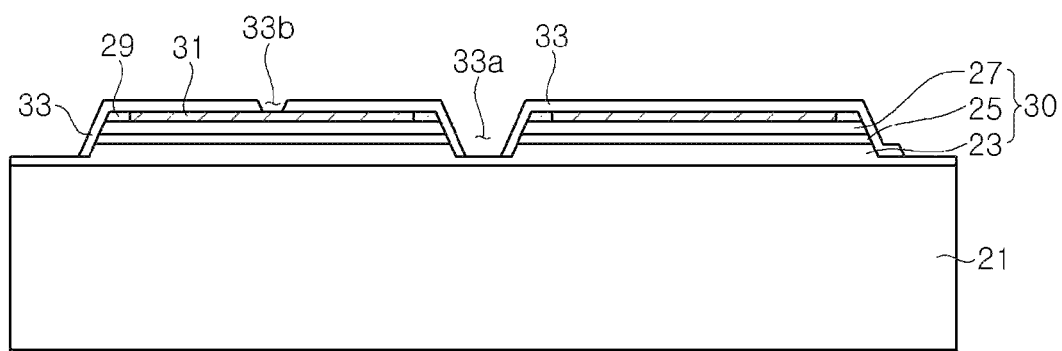

Referring to FIG. 12A and FIG. 12B, a lower insulation layer 33 is formed to cover the ohmic oxide layer 29 and the ohmic reflection layer 31. The lower insulation layer 33 also covers side surfaces of the mesa M and a sidewall of the through-hole 30a. On the other hand, the lower insulation layer 33 has first openings 33a which expose the first conductivity type semiconductor layer 23 and second openings 33b which expose the ohmic reflection layer 31.

For example, the first openings 33a may be formed inside the through-hole 30a and may also be formed near the indented portion 30b. Furthermore, the lower insulation layer 33 may cover a portion of the first conductivity type semiconductor layer 23 along the periphery of the mesa M. With this structure, the first conductivity type semiconductor layer 23 may be partially exposed along the periphery of the mesa M.

The second openings 33b are placed on the ohmic reflection layer 31 above the mesa M. A plurality of second openings 33b may be arranged to be biased to one side of the mesa M. The ohmic reflection layer 31 is exposed through the second openings 33b. Although the lower insulation layer 33 is shown as having five second openings 33b in this exemplary embodiment, it should be understood that other implementations are also possible. The lower insulation layer 33 may have one second opening 33b or at least two second openings 33b.

Figure 13A:
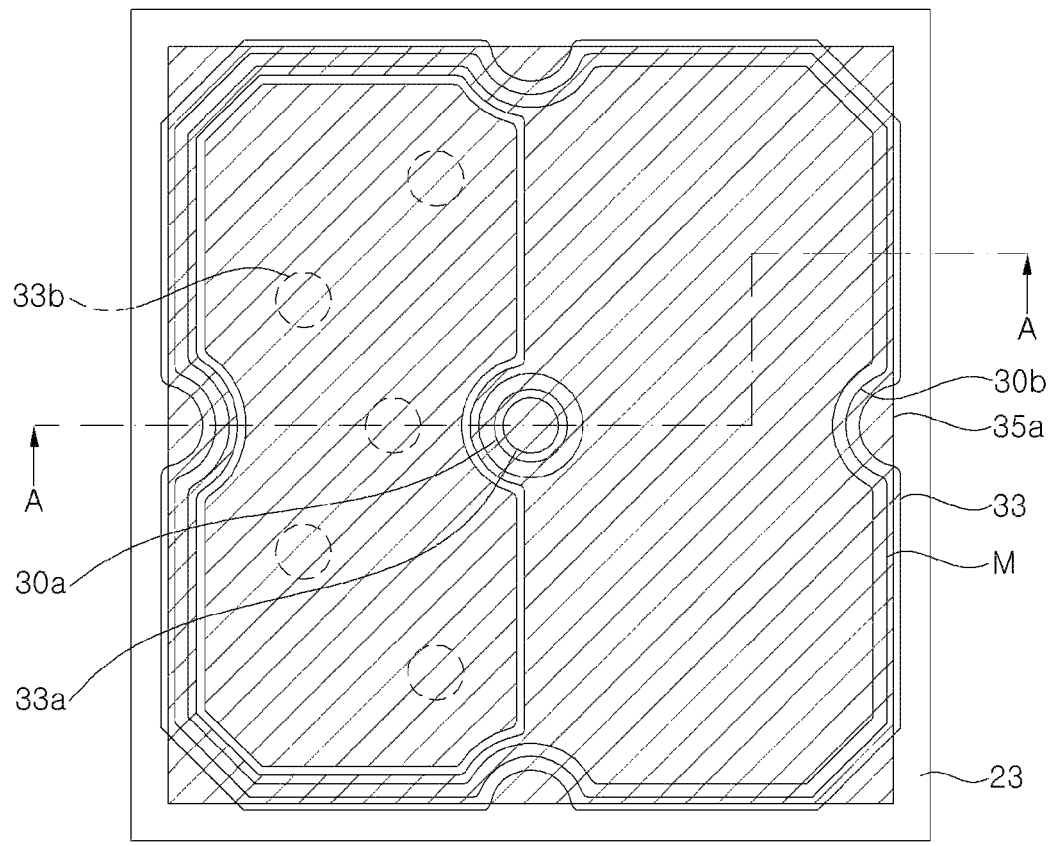
Figure 13B:
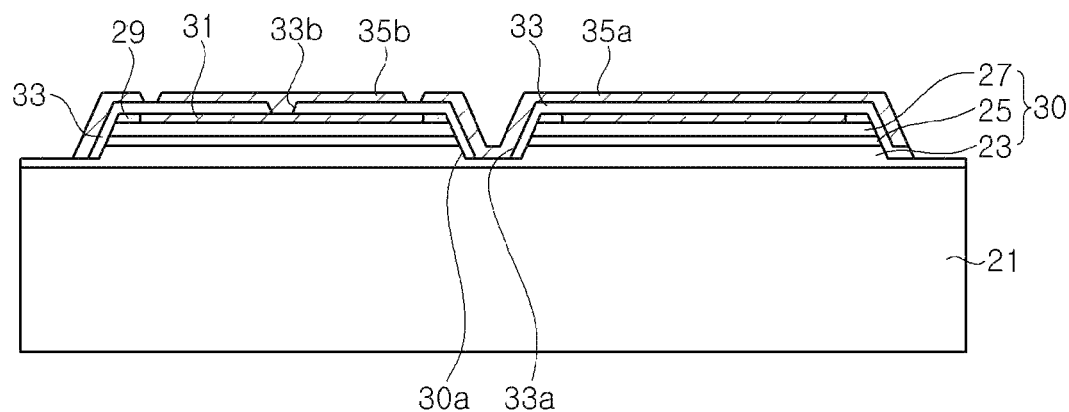

Referring to FIG. 13A and FIG. 13B, a first pad metal layer 35a and a second pad metal layer 35b are formed on the lower insulation layer 33. The first pad metal layer 35a is electrically connected to the first conductivity type semiconductor layer 23 exposed through the first openings 33a and the second pad metal layer 35b is electrically connected to the ohmic reflection layer 31 exposed through the second openings 33b.

The first pad metal layer 35a may be connected to the first conductivity type semiconductor layer 23 exposed through the first openings 30a formed inside the through-hole 30a and near the indented portion 30b, and may also be connected to the first conductivity type semiconductor layer 23 near the corners of the mesa M. The first pad metal layer 35a may include an inner contact portion contacting the first conductivity type semiconductor layer 23 through the through-hole 30a and outer contact portions contacting the first conductivity type semiconductor layer 23 around the mesa M. The inner and outer contact portions of the first pad metal layer 35a allow electric current to be uniformly spread over the entirety of the mesa M.

The second pad metal layer 35b may be surrounded by the first pad metal layer 35a and a boundary region 35ab may be formed between the first pad metal layer 35a and the second pad metal layer 35b. The second pad metal layer 35b covers the second openings 33b and may be placed only above the mesa M.

The first pad metal layer 35a and the second pad metal layer 35b may be formed of the same material by, for example, a lift-off process and thus may be placed on the same level.

Figure 14A:
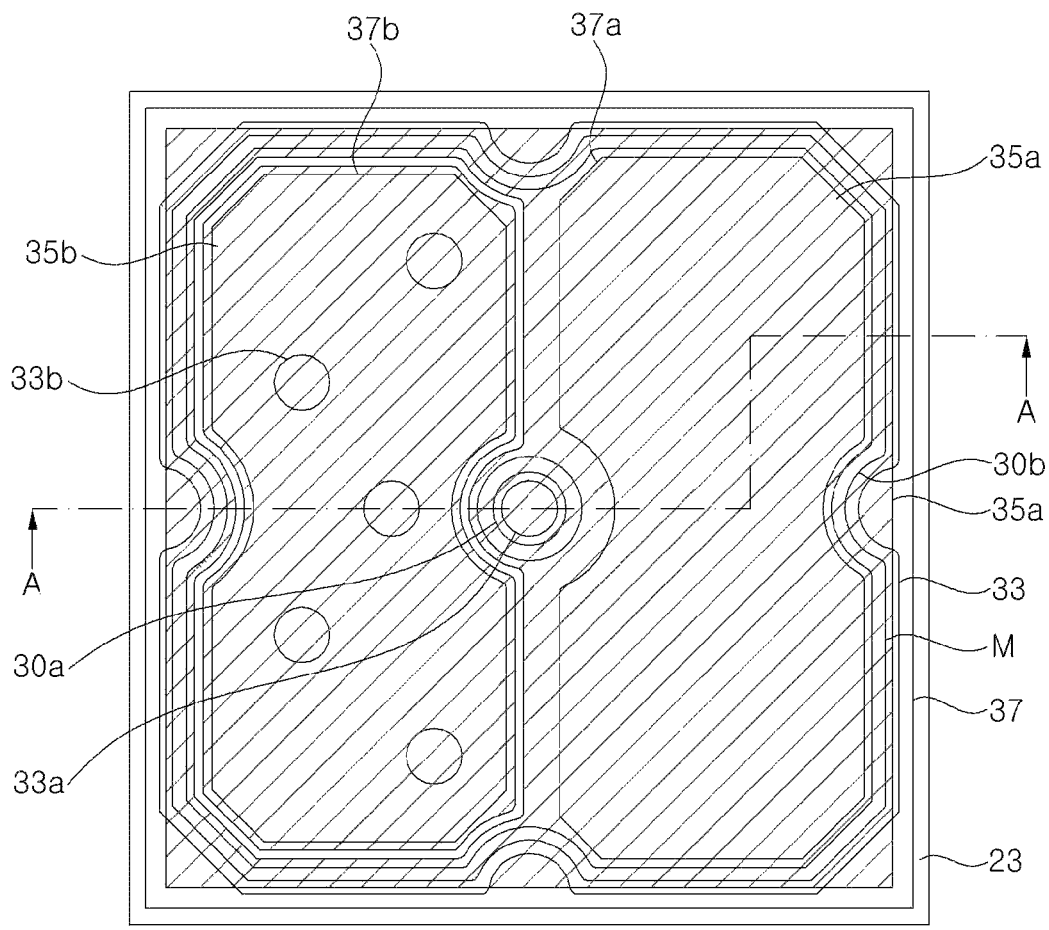
Figure 14B:
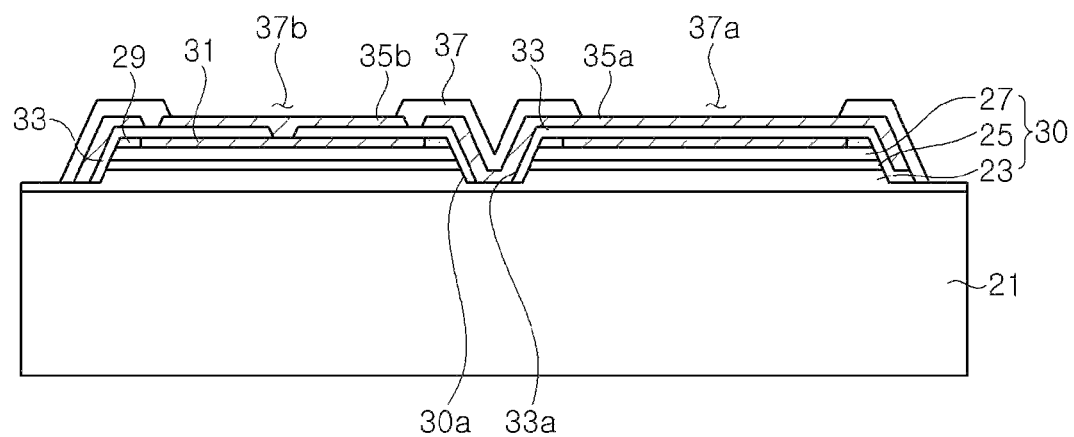

Referring to FIG. 14A and FIG. 14B, an upper insulation layer 37 is formed on the first pad metal layer 35a and the second pad metal layer 35b. The upper insulation layer 37 includes a first opening 37a which exposes the first pad metal layer 35a and a second opening 37b which exposes the second pad metal layer 35b. The upper insulation layer 37 may cover the lower insulation layer 33 around the mesa M and may expose the first conductivity type semiconductor layer 23 along the periphery of the mesa M. The outer contact portions of the first pad metal layer 35a formed near the indented portion 30b and the corners of the mesa M are also covered by the upper insulation layer 37.

The second opening 37b may be placed only in an upper region of the second pad metal layer 35b. The first opening 37a is placed only in an upper region of the first pad metal layer 35a, particularly in an upper region of the mesa M, without being limited thereto. The first opening 37a is spaced apart from the second opening 37b.

Although each of the first opening 37a and the second opening 37b is illustrated as being formed singularly in this exemplary embodiment, the upper insulation layer 37 may have a plurality of first openings 37a and a plurality of second openings 37b.

Furthermore, although the second opening 37b is illustrated as overlapping the second openings 33b of the lower insulation layer 33, the second opening 37b may be formed to be spaced apart from the second openings 33b in the horizontal direction so as not to overlap each other.

Figure 15A:
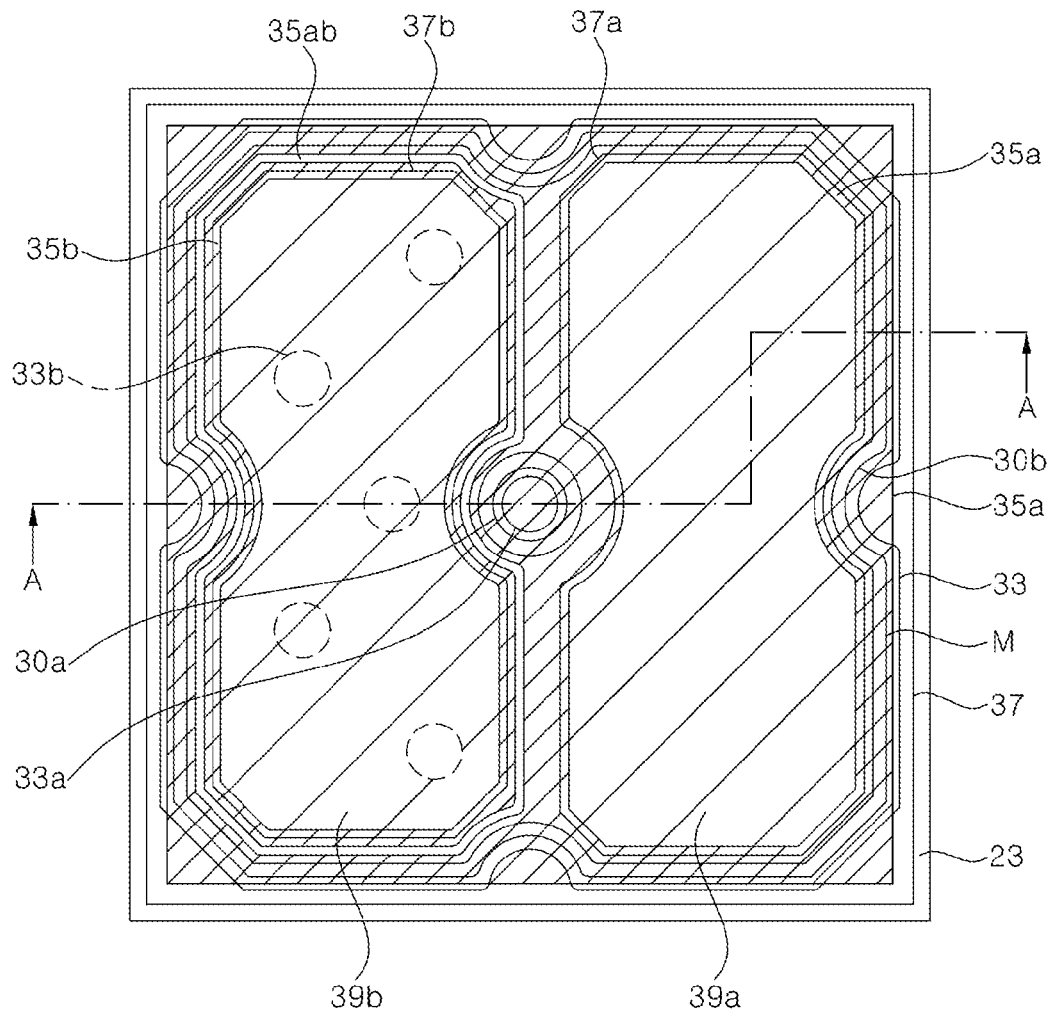
Figure 15B:
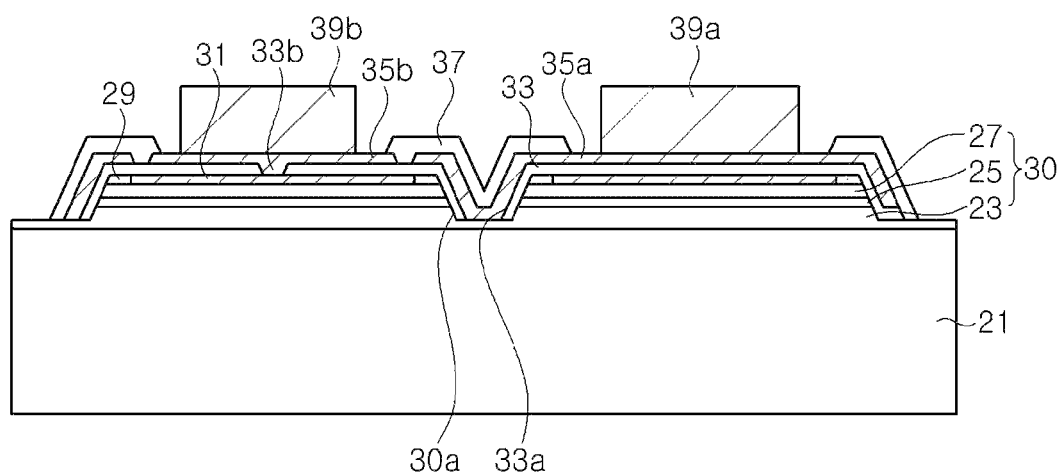

Referring to FIG. 15A and FIG. 15B, a first bump pad 39a and a second bump pad 39b are formed inside the first and second openings 37a, 37b of the upper insulation layer 37, respectively. The first and second bump pads 39a, 39b may be formed of, for example, AuSn. The first and second bump pads 39a, 39b are pads bonded to a submount or a lead frame when the light emitting diode is mounted on the submount or the lead frame. The first and second bump pads 39a, 39b may be formed by a well-known process, such as a lift-off process.

In this exemplary embodiment, the first and second bump pads 39a, 39b are formed inside the first and second openings 37a, 37b, respectively, but are not limited thereto. Alternatively, the first and second bump pads 39a, 39b may be formed to completely cover the first and second openings 37a, 37b, respectively.

Figure 16A:
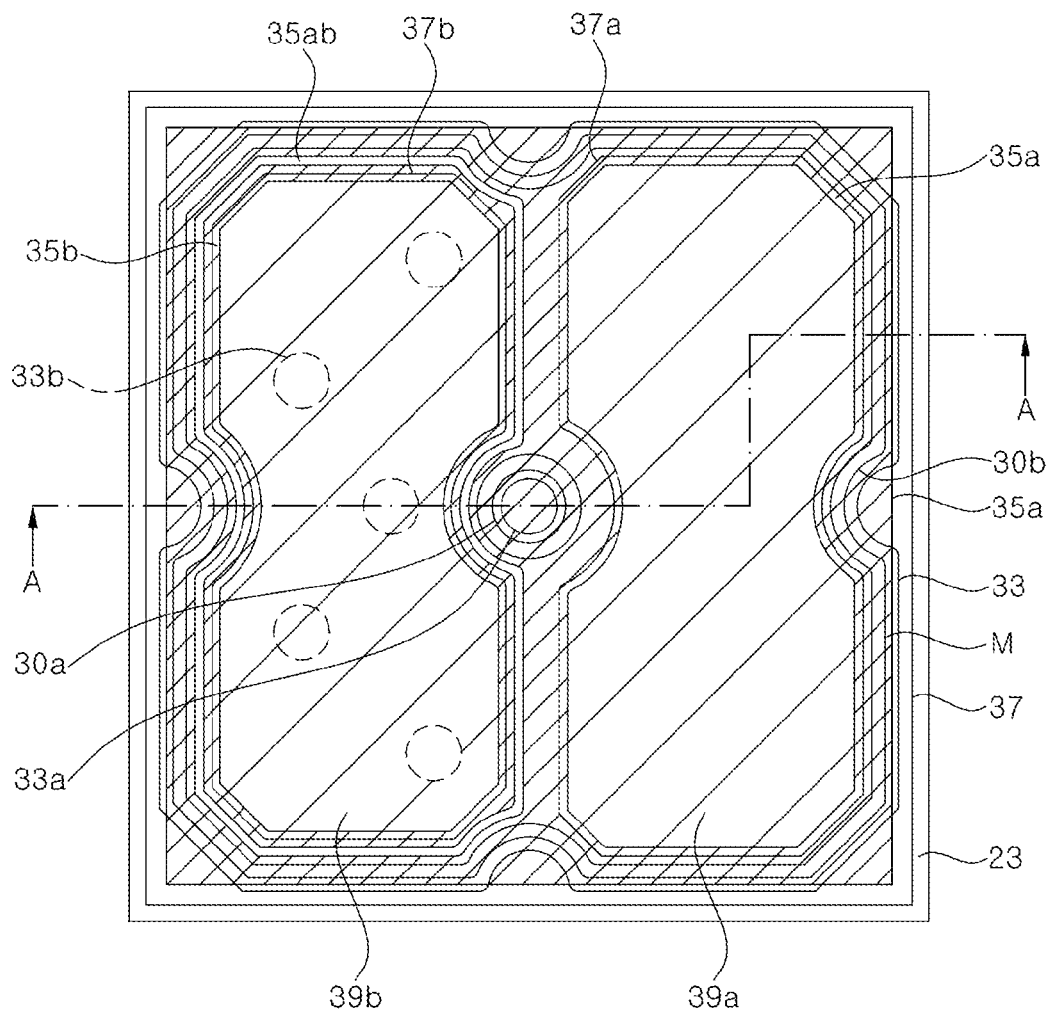
Figure 16B:
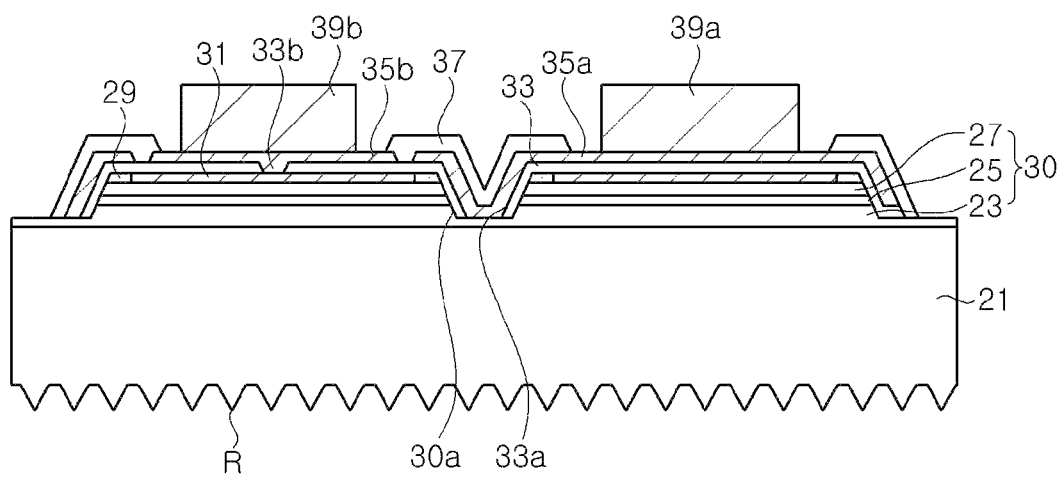

Referring to FIG. 16A and FIG. 16B, after formation of the first and second bump pads 39a, 39b, a lower surface of the substrate 21 is subjected to grinding to reduce the thickness of the substrate 21 and a roughened surface R is formed on the ground lower surface of the substrate 21. The lower surface of the substrate 21 may be ground by lapping and/or polishing and the roughened surface R may be formed by dry and wet etching.

Referring to FIGS. 17A-17D, a method of forming a side reflection layer 41 on a side surface of the substrate 21 will be described. FIGS. 17A-17D show schematic cross-sectional views illustrating the method of forming the side reflection layer 41 of the light emitting diode 100 according to the exemplary embodiment of the present disclosure. Although FIGS. 17A-17D show two light emitting diode regions formed by the processes described with reference to FIG. 9 to FIG. 16B, a larger number of light emitting diode regions may be formed on the substrate 21, and the mesa M and the bump pads 39a, 39b may be formed on each of the light emitting diode regions.

Figure 17A:
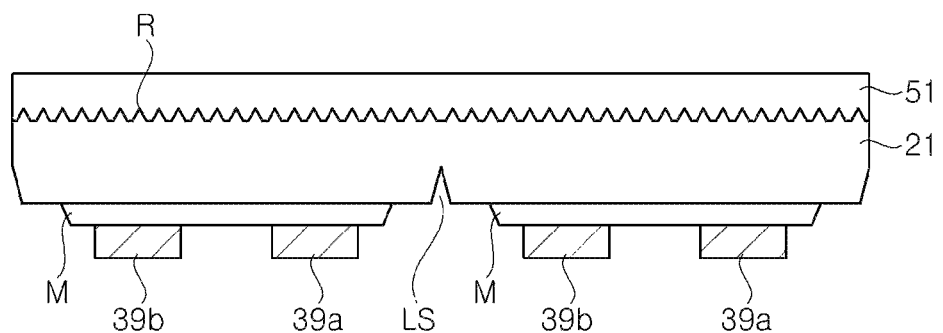

Referring to FIG. 17A, after formation of the first and second bump pads 39a, 39b, a scribing line LS is formed from the first conductivity type semiconductor layer 21 into the substrate 21. The scribing line LS corresponds to an isolation region between light emitting diodes and thus, a plurality of scribing lines LSs may be formed in a mesh shape on the substrate 21.

A photoresist layer 51 is coated onto the substrate 21 having the roughened surface R thereon. The photoresist layer 51 may be formed on the substrate 21 by spin coating or the like.

Figure 17B:
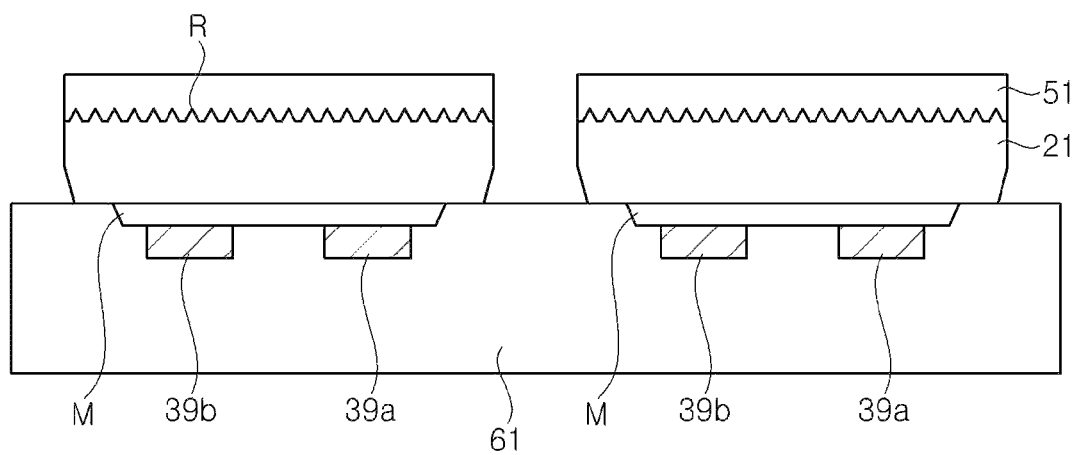

Referring to FIG. 17B, individual light emitting diode regions are divided from each other on a extendable tape, such as a blue tape, which in turn is extended to separate the individual light emitting diode regions from each other. Thereafter, the divided individual light emitting diode regions are transferred to a support 61 such that the individual light emitting diodes can be attached thereto. For example, the support 61 may be a polymer or polyimide film or another support substrate. The divided individual light emitting diode regions may be individually transferred to a polymer or polyimide film, or may be attached or transferred to the support substrate. Here, the mesa M may be embedded in the support 61 such that the first conductivity type semiconductor layer 23 exposed around the mesa M can adjoin an upper surface of the support 61. However, it should be understood that other implementations are also possible. A contact region between the light emitting diode regions and the support 61 may be adjusted and the first conductivity type semiconductor layer 23 may be partially embedded in the support 61 in the thickness direction.

On the other hand, the side surface of the substrate 21 in each of the individual light emitting diode regions may have an inclined side surface formed by scribing and a perpendicular side surface formed by breaking.

Figure 17C:
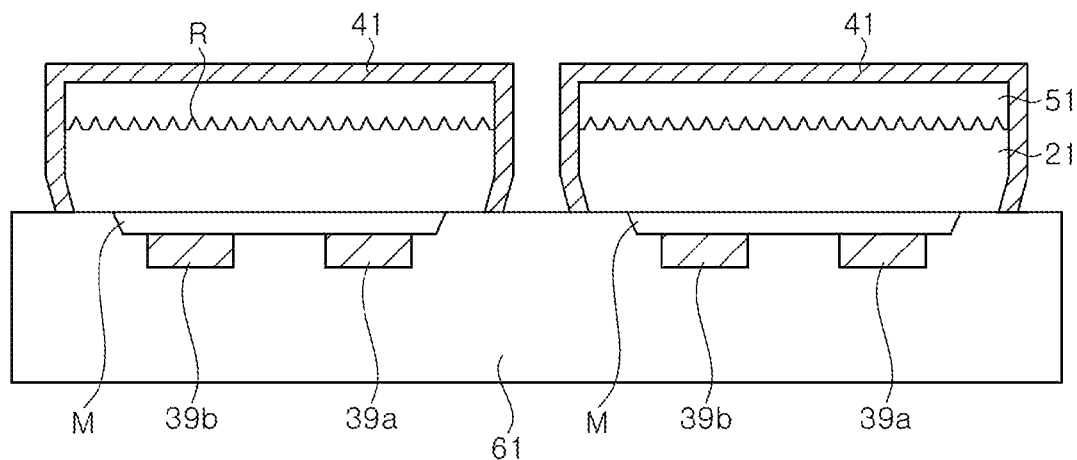

Referring to FIG. 17C, a side reflection layer 41 is deposited on each of the individual light emitting diode regions. The side reflection layer 41 may be deposited thereon by, for example, sputtering. The side reflection layer 41 includes a metal reflection layer such as an Ag layer or an Al layer. The side reflection layer 41 is the same as the side reflection layer described with reference to FIG. 1 and FIG. 2 and detailed description thereof will be omitted.

The side reflection layer 41 is formed on the side surface of the substrate 21 to have a substantially uniform thickness on the inclined side surface and the perpendicular side surface. Since the exposed surface of the first conductivity type semiconductor layer 23 is shielded by the support 61, the side reflection layer 41 is prevented from being formed on the exposed surface of the first conductivity type semiconductor layer 23. Therefore, the side reflection layer 41 can be prevented from overlapping the first pad metal layer 35a.

Figure 17D:
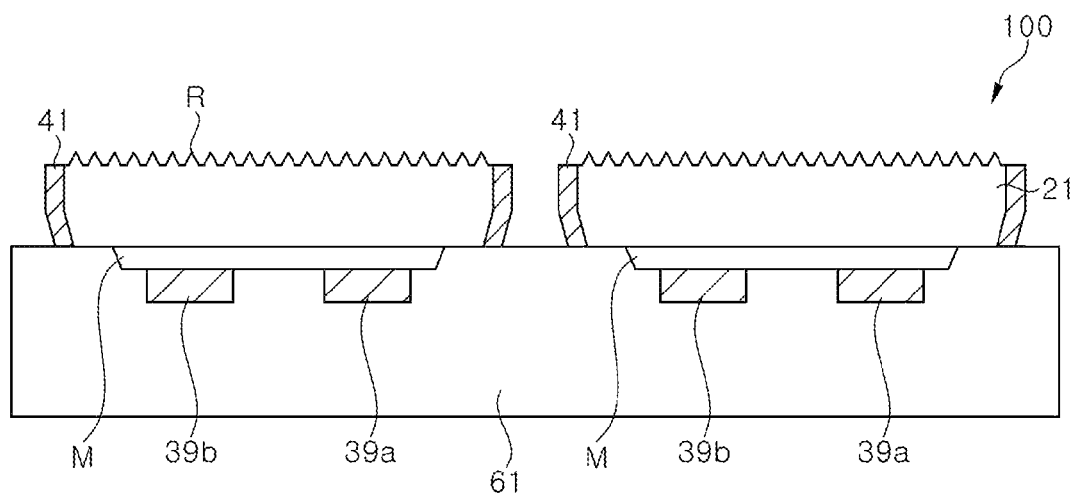

Referring to FIG. 17D, the side reflection layer 41 can be removed from the upper side of the substrate 21 by removing the photoresist layer 51 and the light emitting diode 100 is completed by removing the support 61 therefrom.

On the other hand, although the scribing line LS is formed using a laser in this exemplary embodiment, the scribing line LS may be formed using a blade. In this case, the inclined side surface of the substrate 21 may be formed to have a gentler inclination.

In addition, although the scribing line LS is formed after formation of the first and second bump pads 39a, 39b in this exemplary embodiment, the scribing line LS may also be formed before formation of the upper insulation layer 37. In this case, the upper insulation layer 37 may be formed inside the scribing line LS, thereby providing a light emitting diode 200 as shown in FIG. 3.

Viewing angles of a light emitting diode according to one exemplary embodiment were measured in orthogonal directions. As a result, it could be seen that, when the side reflection layer 41 was not formed, the light emitting diode had viewing angles of 130 and 150 degrees in the X-direction and the Y-direction, respectively, and when the side reflection layer 41 was formed, the light emitting diode had viewing angles of 103.5 degrees and 115 degrees in the X-direction and the Y-direction, respectively. Here, the substrate 21 had a thickness of about 250 μm. As such, when the side reflection layer 41 is employed, a light emitting diode having a viewing angle of 115 degrees or less can be easily provided.

FIGS. 18A-18D show cross-sectional views illustrating a method of manufacturing a light emitting diode 300 according to a further exemplary embodiment of the present disclosure. As described with reference to FIG. 9A to FIG. 16B, light emitting diode regions are formed on a substrate 21, and a mesa M and bump pads 39a, 39b are formed on each of the light emitting diode regions.

Figure 18A:
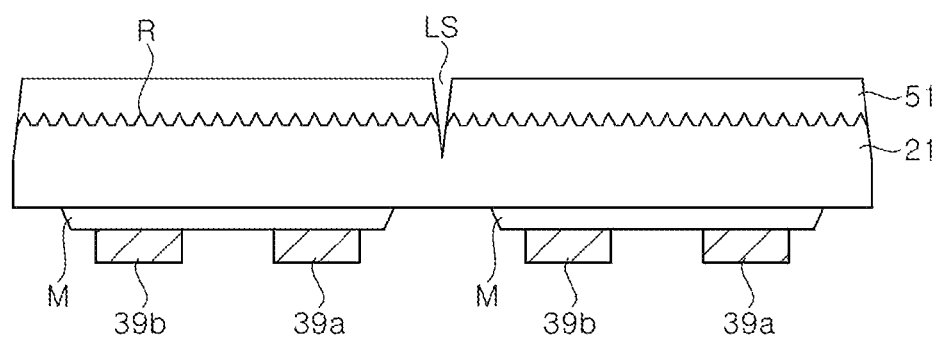
FIG. 18A, FIG. 18B, FIG. 18C and FIG. 18D are schematic cross-sectional views illustrating a method of manufacturing a light emitting diode according to a further exemplary embodiment of the present disclosure.

Referring to FIG. 18A, after formation of the first and second bump pads 39a, 39b, for example, a masking material 51 is coated onto the substrate 21 having a roughened surface R thereon. The masking material 51 may be formed on the substrate 21 by spin coating or the like.

Then, a scribing line LS is formed on an upper surface of the substrate 21, that is, from the masking material 51 side into the substrate 21. The scribing line LS corresponds to an isolation region between light emitting diodes and thus a plurality of scribing lines LSs may be formed in a mesh shape on the substrate 21. The scribing line may be formed using a laser and chemical treatment, such as phosphoric acid treatment, may be performed in order to remove debris from the side surface of the substrate 21 while relieving surface roughness of the substrate 21 formed by the laser.

Figure 18B:
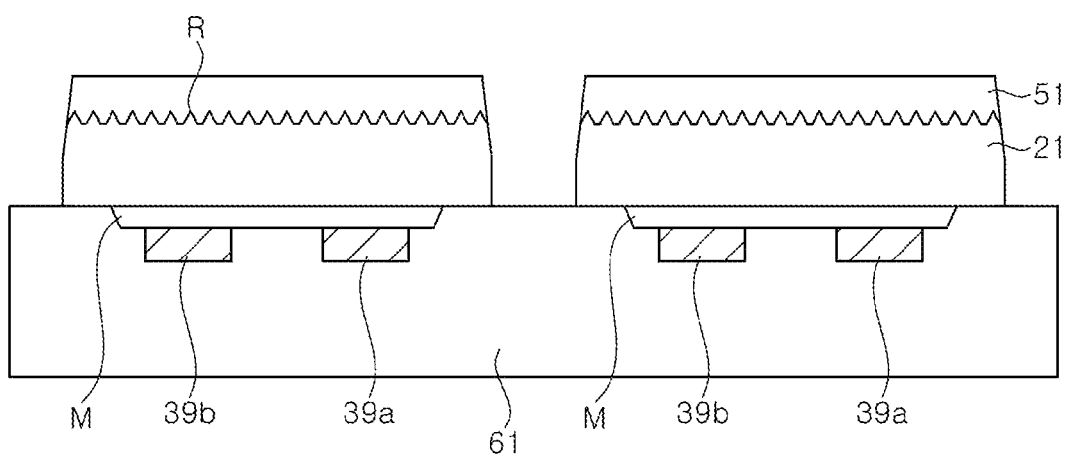

Referring to FIG. 18B, individual light emitting diode regions are divided from each other on a stretchable tape such as a blue tape, which in turn is stretched to separate the individual light emitting diode regions from each other, as described with reference to FIG. 17B. Thereafter, the divided individual light emitting diode regions are transferred to a support 61 such that the individual light emitting diodes can be attached thereto.

On the other hand, the side surface of the substrate 21 in the individual light emitting diode regions may have an inclined side surface formed by scribing and a perpendicular side surface formed by breaking.

Figure 18C:
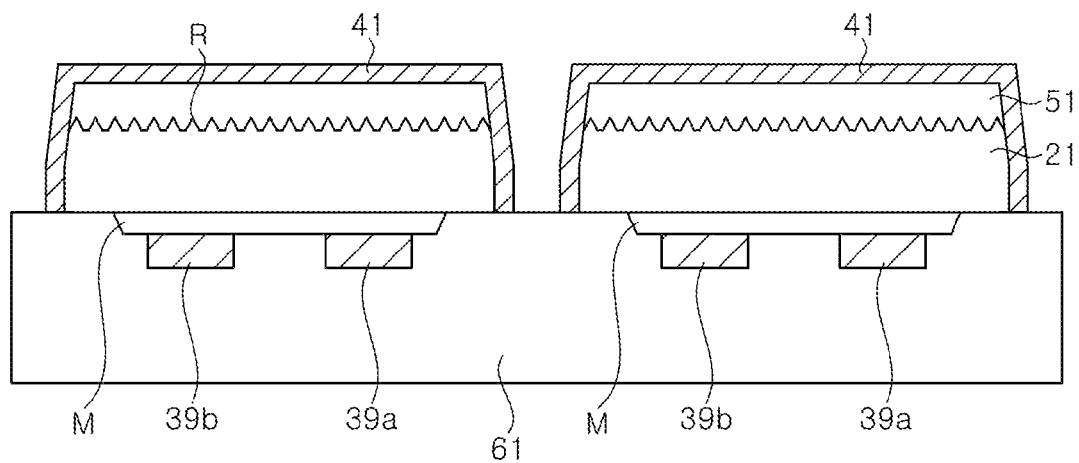

Referring to FIG. 18C, a side reflection layer 41 is deposited on each of the individual light emitting diode regions. The side reflection layer 41 may be deposited thereon by, for example, sputtering. The side reflection layer 41 includes a metal reflection layer such as an Ag layer or an Al layer. The side reflection layer 41 is the same as the side reflection layer described with reference to FIG. 1 and FIG. 2, and a detailed description thereof will be omitted.

The side reflection layer 41 is formed on the side surface of the substrate 21 to have a substantially uniform thickness on the inclined side surface and the perpendicular side surface. Since the exposed surface of the first conductivity type semiconductor layer 23 is shielded by the support 61, the side reflection layer 41 is prevented from being formed on the exposed surface of the first conductivity type semiconductor layer 23. Therefore, the side reflection layer 41 can be prevented from overlapping the first pad metal layer 35a.

Figure 18D:
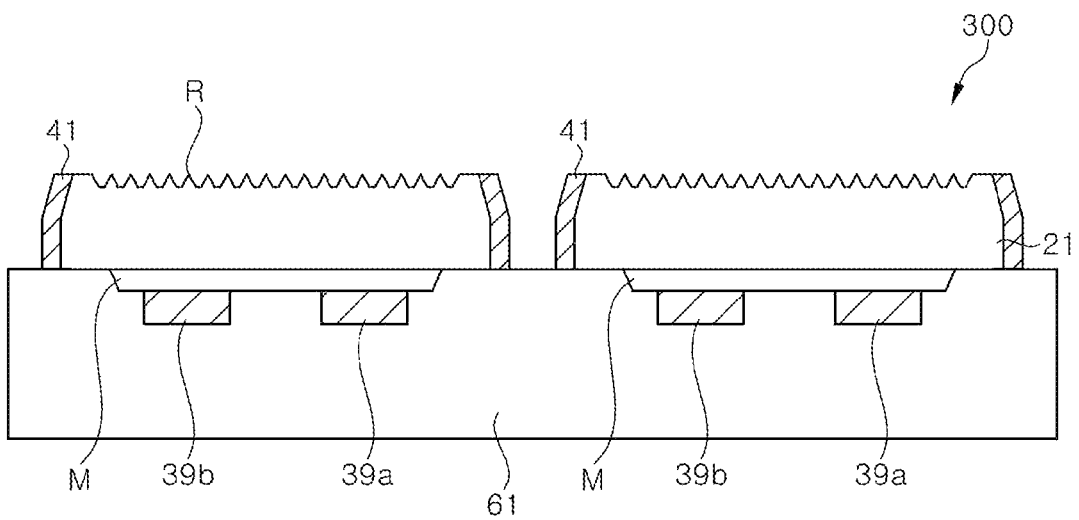

Referring to FIG. 18D, the side reflection layer 41 can be removed from the upper side of the substrate 21 by removing the masking material 51 and the light emitting diode 300 is completed by removing the support 61 therefrom.

Although the scribing line LS is formed using a laser in this exemplary embodiment, the scribing line LS may be formed using a blade. In this case, the inclined side surface of the substrate 21 may be formed to have a gentler inclination.

Figure 19:
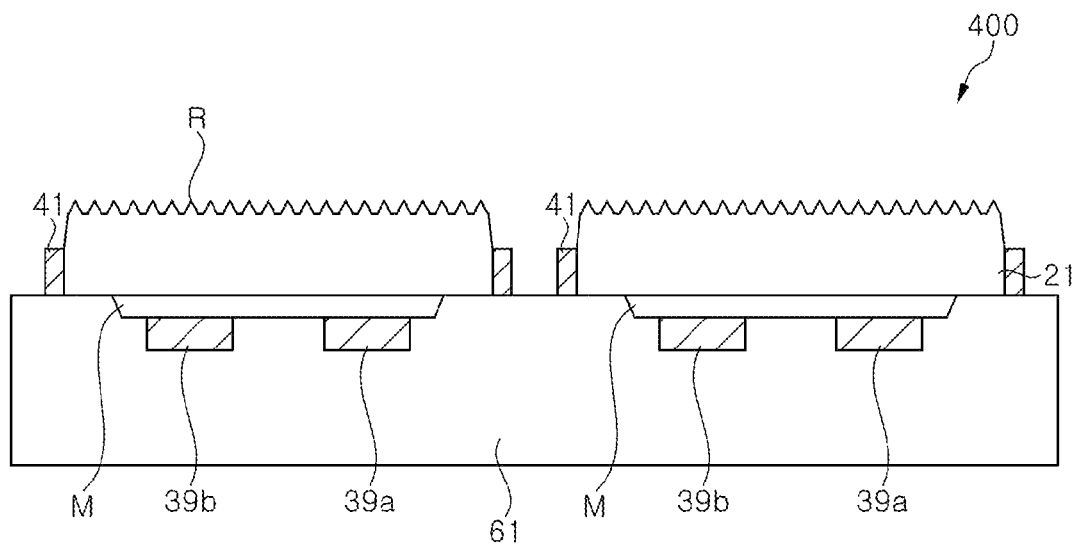
FIG. 19 is a schematic cross-sectional view illustrating a method of manufacturing a light emitting diode according to yet another exemplary embodiment of the present disclosure.

FIG. 19 shows cross-sectional views illustrating a method of manufacturing a light emitting diode 400 according to yet another exemplary embodiment of the present disclosure.

The method of manufacturing the light emitting diode 400 according to this exemplary embodiment is generally similar to the method of manufacturing the light emitting diode 300 described with reference to FIG. 18 except that the side reflection layer 41 does not cover the inclined side surface of the substrate 21.

In this exemplary embodiment, after formation of the scribing line using a laser, surface roughness of the substrate 21 formed by laser scribing is adjusted by adjusting chemical treatment, such as phosphoric acid treatment. A rough surface may be formed on the inclined side surface by laser scribing and the side reflection layer 41 may be formed on the side surface of the substrate excluding the rough surface by reducing a time for phosphoric acid treatment.

Accordingly, the height of the side reflection layer 41 can be reduced with increasing depth of laser scribing, thereby increasing the viewing angle of the light emitting diode.

FIGS. 20A-20D show cross-sectional views illustrating a method of manufacturing a light emitting diode 500 according to yet another exemplary embodiment of the present disclosure.

As described with reference to FIG. 9A to FIG. 16B, light emitting diode regions are formed on a substrate 21, and a mesa M and bump pads 39a, 39b are formed on each of the light emitting diode regions.

Figure 20A:
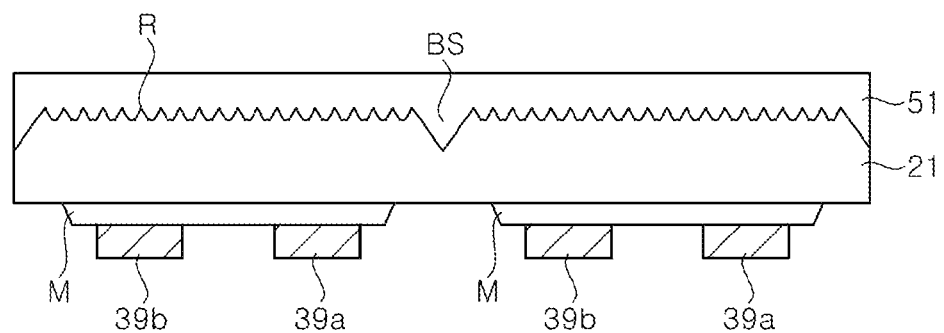
FIG. 20A, FIG. 20B, FIG. 20C and FIG. 20D are schematic cross-sectional views illustrating a method of manufacturing a light emitting diode according to yet another exemplary embodiment of the present disclosure.

Referring to FIG. 20A, after formation of the first and second bump pads 39a, 39b, a scribing line BS is formed using a blade on an upper surface of the substrate 21 having a roughened surface R thereon. The scribing line BS corresponds to an isolation region between light emitting diodes and thus a plurality of scribing lines BSs may be formed in a mesh shape on the substrate 21.

Then, for example, a masking material 51 is coated onto the substrate 21. The masking material 51 may be formed on the substrate 21 by spin coating or the like. The scribing line BS formed using a blade is formed of relatively wide V-shaped grooves. Thus, the scribing line is filled with the masking material 51.

Figure 20B:
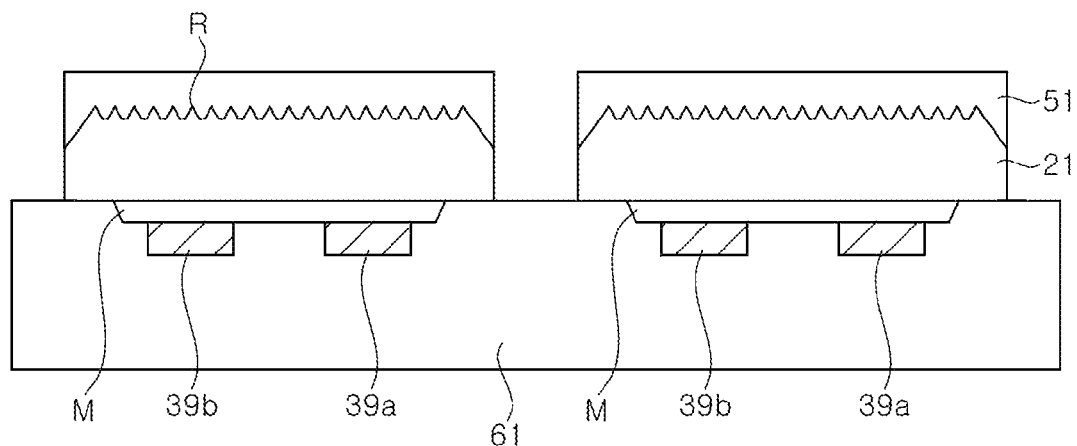

Referring to FIG. 20B, individual light emitting diode regions are divided from each other on a stretchable tape such as a blue tape, which in turn is stretched to separate the individual light emitting diode regions from each other, as described with reference to FIG. 17B. Thereafter, the divided individual light emitting diode regions are transferred to a support 61 such that the individual light emitting diodes can be attached thereto.

The side surface of the substrate 21 in the individual light emitting diode regions may have an inclined side surface formed by a blade and a perpendicular side surface formed by breaking.

Figure 20C:
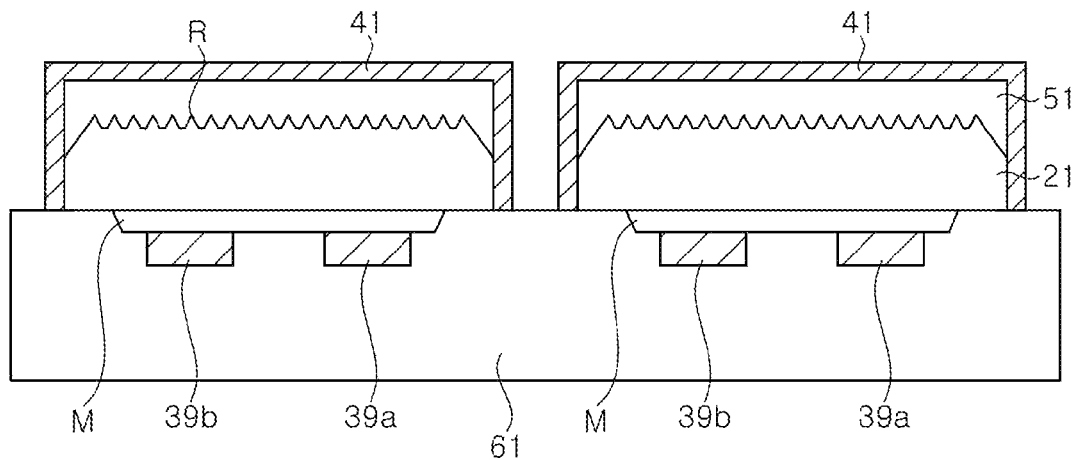

Referring to FIG. 20C, a side reflection layer 41 is deposited on each of the individual light emitting diode regions. The side reflection layer 41 may be deposited thereon by, for example, sputtering. The side reflection layer 41 includes a metal reflection layer such as an Ag layer or an Al layer. The side reflection layer 41 is the same as the side reflection layer described with reference to FIG. 1 and FIG. 2 and detailed description thereof will be omitted.

The side reflection layer 41 is formed on the perpendicular side surface to have a substantially uniform thickness. However, since the inclined side surface is covered by the masking material 51, the side reflection layer 41 is prevented from being formed on the inclined side surface. In addition, since the exposed surface of the first conductivity type semiconductor layer 23 is shielded by the support 61, the side reflection layer 41 is prevented from being formed on the exposed surface of the first conductivity type semiconductor layer 23. Therefore, the side reflection layer 41 can be prevented from overlapping the first pad metal layer 35a.

Figure 20D:
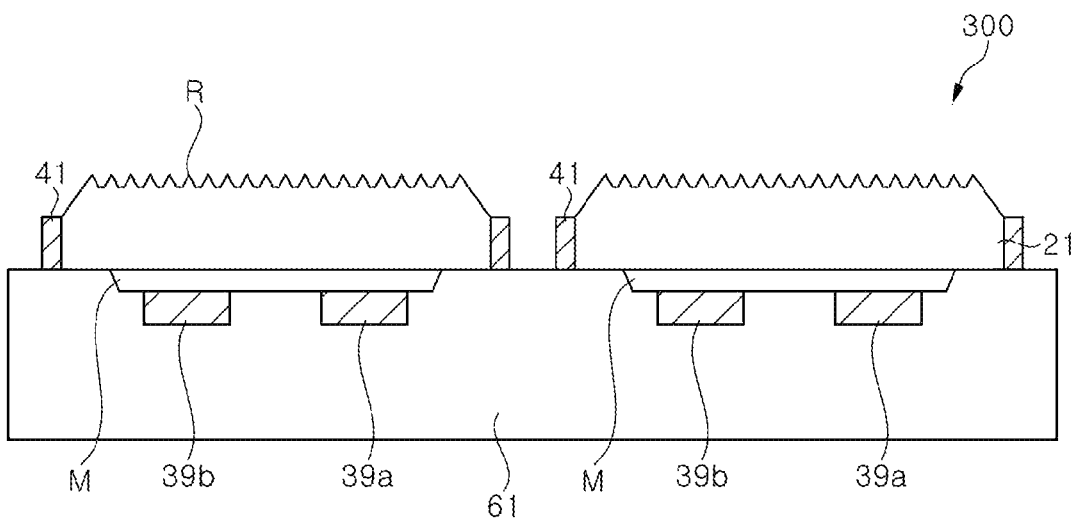

Referring to FIG. 20D, the side reflection layer 41 can be removed from the upper side of the substrate 21 by removing the masking material 51 and the light emitting diode 500 is completed by removing the support 61 therefrom.

Although the scribing line LS is formed using a laser in this exemplary embodiment, the scribing line LS may be formed using a blade. In this case, the inclined side surface of the substrate 21 may be formed to have a gentler inclination.

In the above description, various techniques for forming the side reflection layer 41 using laser scribing or blade scribing have been described.

The substrate 21 may be divided using a stealth laser that forms a focus inside the substrate 21. In this case, the side surface of the substrate 21 is formed to have a perpendicular side surface. Accordingly, the light emitting diode 600 of FIG. 7 can be manufactured by a dicing technique using the stealth laser. In addition, a rough surface may be formed in a band shape along the side surface of the substrate 21 through irradiation using the stealth laser, and the light emitting diode 700 of FIG. 8 can be manufactured based on the fact that the side reflection layer 41 is not compatible with the rough surface.

Figure 21:
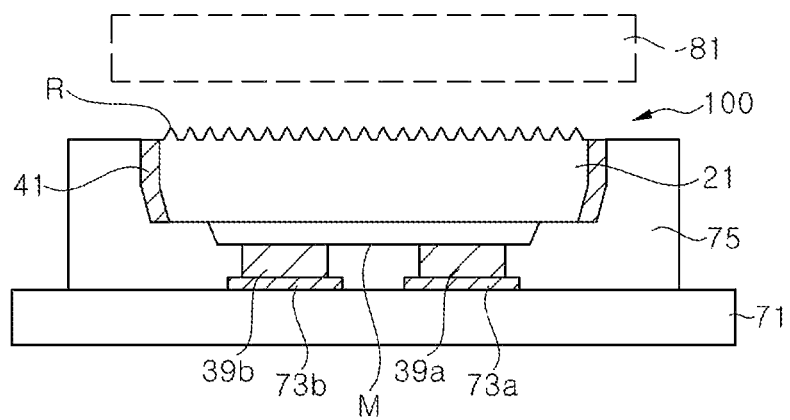
FIG. 21 is a schematic sectional view of a light emitting module according to one exemplary embodiment of the present disclosure.

FIG. 21 is a schematic cross-sectional view of a light emitting module according to one exemplary embodiment of the present disclosure.

Referring to FIG. 21, the light emitting module includes a support substrate 71, a light emitting diode 100, and a wavelength converter 81. The light emitting module may further include a white barrier layer 75.

The light emitting diode 100 is the same as the light emitting diode described with reference to FIG. 1 and FIG. 2, and is flip bonded onto a support substrate 71, on which the first and second pads 73a, 73b are disposed, via the first and second bump pads 39a, 39b. The support substrate 71 may be, for example, a submount, a printed circuit board, or a lead frame.

On the other hand, a white barrier layer 75 may cover the side surface of the light emitting diode 100. The white barrier layer 75 may be formed by mixing, for example, $TiO_2$ with a silicone resin or an epoxy resin. The white barrier layer 75 can have defects, such as cracks therein, over time. Thus, when the white barrier layer 75 is directly formed on the side surface of the light emitting diode without the side reflection layer 41, light emitted from the light emitting diode can leak through the white barrier layer 75. However, according to the exemplary embodiments, the side reflection layer 41 is formed on the side surface of the light emitting diode, thereby providing a light emitting module that does not suffer from light leakage even after use for a long period of time.

The wavelength converter 81 such as a phosphor sheet or a wavelength converting plate may be disposed on an upper side of the light emitting diode 100. The wavelength converting plate 81 may contain ceramic plate phosphors, particularly, phosphor-in-glass (PIG) or SiC phosphors. With this structure, it is possible to provide a wavelength converter that can be used for a long time by preventing discoloration under high temperature conditions.

The wavelength converting plate 81 may be attached to the light emitting diode 100 using a bonding agent, or may be attached to the white barrier layer 75 or other components. Thus, the wavelength converting plate 81 may be disposed above the light emitting diode 100 to be spaced apart from the light emitting diode 100.

Although this exemplary embodiment is illustrated using the light emitting diode 100 by way of example, other light emitting diodes 200, 300, 400, 500, 600 or 700 may also be used.

The light emitting module according to this exemplary embodiment may be applied to automobile headlamps, camera flashes, or lighting.

Figure 22:
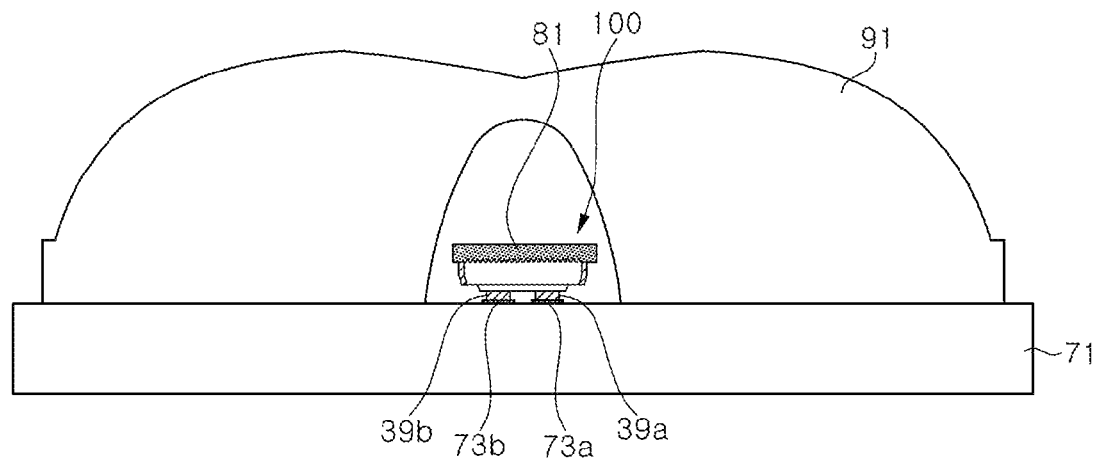
FIG. 22 is a schematic sectional view of a light source module according to one exemplary embodiment of the present disclosure.

FIG. 22 is a schematic cross-sectional view of a light source module according to one exemplary embodiment of the present disclosure.

Referring to FIG. 22, the light source module includes a support substrate 71, a light emitting diode 100, a wavelength converter 81, and a lens 91. The light emitting diode 100 is the same as the light emitting diode described with reference to FIG. 1 and FIG. 2, and is flip bonded to a support substrate 71, on which the first and second pads 73*a*, 73*b* are disposed, via the first and second bump pads 39*a*, 39*b*. The support substrate 71 may be, for example, a printed circuit board.

The lens 91 is disposed above the light emitting diode 100. The lens 91 has a lower surface and an upper surface, in which the lower surface includes a concave portion receiving light emitted from the light emitting diode 100 and the upper surface has a light exit surface through which light exits the lens. The concave portion of the lower surface may be surrounded by a flat surface.

In addition, the upper surface of the lens 91 may include a concave portion placed at the center thereof and a convex portion placed around the concave portion. The convex portion may be formed to surround the concave portion.

The lens 91 is a light dispersing lens configured to spread light. However, it should be understood that other implementations are also possible. That is, the lens 91 having various shapes may be coupled to the light emitting diode 100 to realize various light patterns.

Although the light emitting diode 100 is flip bonded to the support substrate 71 in the light source module according to this exemplary embodiment, other light emitting diodes 200, 300, 400, 500, 600 or 700 may also be mounted on a support substrate 91.

The light source module according to this exemplary embodiment may be suitably applied to, for example, a large TV or a camera flash.

Figure 23:
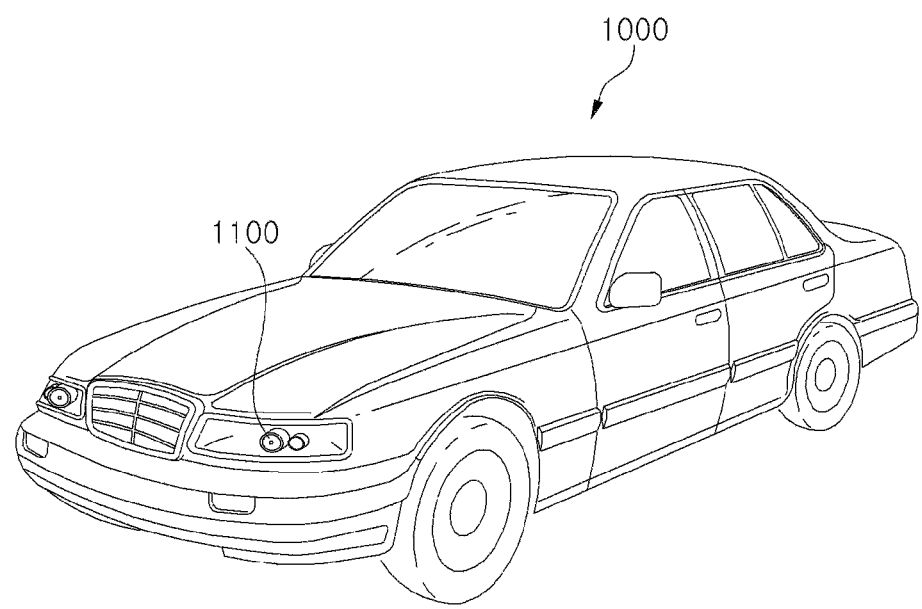
FIG. 23 is a schematic perspective view of an automobile including headlamps to which light emitting diodes according to exemplary embodiments of the present disclosure are applied.

FIG. 23 is a schematic perspective view of an automobile 1000 including headlamps 1100 to which light emitting diodes according to exemplary embodiments of the present disclosure are applied.

Referring to FIG. 23, the light emitting diode 100, 200, 300, 400, 500, 600 or 700 according to the exemplary embodiments of the present disclosure is provided to headlamps 1100 mounted on a front side of an automobile 1000. In this exemplary embodiment, the headlamps 1100 include fog lamps and headlamps for securing a forward view of a driver in day or at night.

The headlamps 1100 may be mounted on both front sides of the automobile 1000 and may have various shapes according to driver preference. In addition, the headlamps 1100 mounted on both front sides of the automobile 1000 may have a symmetrical structure with respect to each other or may have different structures.

The light emitting diode may be provided to the headlamps 1100 in the form of the light source module as described with reference to FIG. 21. However, it should be understood that other implementations are also possible and the light emitting diode may be provided in the form of various shapes of light emitting modules.

Figure 24:
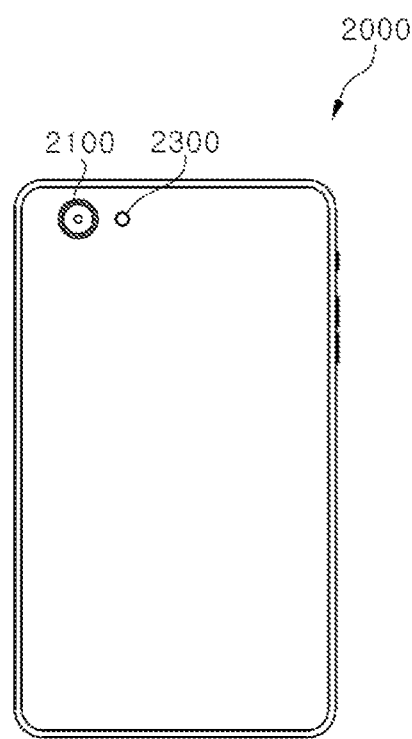
FIG. 24 is a schematic perspective view of a mobile device including a camera flash to which light emitting diodes according to exemplary embodiments of the present disclosure are applied.

FIG. 24 is a schematic perspective view of a mobile device 2000 including a camera flash 2300 to which a light emitting diode according to exemplary embodiments of the present disclosure is applied.

Referring to FIG. 24, the mobile device 2000 includes a camera module 2100 and a flash module 2300. The light emitting diode 100, 200, 300, 400, 500, 600 or 700 according to the exemplary embodiments of the present disclosure is provided to the flash module 2300. The flash module 2300 supplies light to an object when the camera module 2100 is operated to photograph the object.

The light emitting diode may be provided to the camera module 2100 in the form of the light source module as described with reference to FIG. 21. However, it should be understood that other implementations are also possible and the light emitting diode may be provided in the form of various shapes of light emitting modules.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting device, comprising:
   a support having a first pad and a second pad;
   a light emitting diode disposed on the support;
   a side reflection layer disposed on the support and configured to cover a region of the light emitting diode; and
   a barrier disposed on the support and covering a side of the light emitting diode,
   wherein:
   the light emitting diode comprises:
      a substrate;
      a first conductivity type semiconductor layer disposed on the substrate and having a first surface and a second surface opposing the first surface;
      a second conductivity type semiconductor layer disposed on the second surface of the first conductivity type semiconductor layer;
      an active layer disposed between the first conductivity type semiconductor layer and the second conductivity type semiconductor layer;
      an ohmic layer electrically connected to the second conductivity type semiconductor layer;
      an insulation layer covering a region of the ohmic layer; and
      a first bump pad and a second bump pad disposed on the ohmic layer and electrically connected to the first conductivity type semiconductor layer and the second conductivity type semiconductor layer, respectively;
the side reflection layer covers at least a region of the substrate and the first conductivity type semiconductor layer;
the insulation layer has a region disposed between the side reflection layer and the first conductivity type semiconductor layer;
the side reflection layer contacts a region of a side surface of the substrate; and
the side reflection layer is disposed between the barrier and the light emitting diode.

2. The light emitting device of claim 1, wherein side surfaces of the first conductivity type semiconductor layer are inclined with respect to the first surface of the first conductivity type semiconductor layer.

3. The light emitting device of claim 1, wherein an upper surface of the substrate has a roughened region.

4. The light emitting device of claim 1, wherein the side reflection layer contacts a side surface of the insulation layer and the substrate.

5. The light emitting device of claim 1, further comprising a wavelength conversion layer disposed on the support.

6. The light emitting device of claim 5, wherein the wavelength conversion layer is disposed on the side reflection layer and the light emitting diode.

7. The light emitting device of claim 5, wherein the wavelength conversion layer comprises a phosphor sheet or a phosphor plate and is disposed on an upper surface of the light emitting diode.

8. The light emitting device of claim 7, wherein an adhesive layer is disposed between the wavelength conversion layer and the light emitting diode.

9. The light emitting device of claim 1, wherein the side reflection layer has a region connected to the barrier.

10. A light emitting device, comprising:
a support having a first pad and a second pad;
a light emitting diode disposed on the support;
a side reflection layer disposed on the support and configured to cover a region of the light emitting diode; and
a resin layer disposed on the substrate,
wherein:
the light emitting diode comprises:
a substrate;
a first conductivity type semiconductor layer disposed on the substrate and having a first surface and a second surface opposing the first surface;
a second conductivity type semiconductor layer disposed on the second surface of the first conductivity type semiconductor layer;
an active layer disposed between the first conductivity type semiconductor layer and the second conductivity type semiconductor layer;
an ohmic layer electrically connected to the second conductivity type semiconductor layer;
an insulation layer covering a region of the mesa and the ohmic layer; and
a first bump pad and a second bump pad disposed on the ohmic layer and electrically connected to the first conductivity type semiconductor layer and the second conductivity type semiconductor layer, respectively;
the side reflection layer covers at least a region of the substrate and the first conductivity type semiconductor layer;
the insulation layer has a region disposed between the side reflection layer and the first conductivity type semiconductor layer,
the side reflection layer contacts a region of a side surface of the substrate, and
the resin layer has a region connected to the side reflection layer.

11. The light emitting device of claim 10, wherein side surfaces of the first conductivity type semiconductor layer are inclined with respect to the first surface of the first conductivity type semiconductor layer.

12. The light emitting device of claim 10, wherein the side reflection layer contacts a side surface of the insulation layer and the substrate.

13. The light emitting device of claim 10, further comprising a wavelength conversion layer disposed on the support.

14. The light emitting device of claim 13, wherein the wavelength conversion layer disposed on the side reflection layer and the light emitting diode.

15. The light emitting device of claim 10, wherein the side reflection layer disposed between the barrier and the light emitting diode.

16. A light emitting device, comprising:
a support having a first pad and a second pad;
a light emitting diode disposed on the support;
a side reflection layer disposed on the support and configured to cover a region of the light emitting diode;
a resin layer disposed on the substrate,
wherein:
the light emitting diode comprises:
a substrate;
a first conductivity type semiconductor layer disposed on the substrate and having a first surface and a second surface opposing the first surface;
a second conductivity type semiconductor layer disposed on the second surface of the first conductivity type semiconductor layer;
an active layer disposed between the first conductivity type semiconductor layer and the second conductivity type semiconductor layer;
an ohmic layer electrically connected to the second conductivity type semiconductor layer;
an insulation layer covering a region of the mesa and the ohmic layer; and
a first bump pad and a second bump pad disposed on the ohmic layer and electrically connected to the first conductivity type semiconductor layer and the second conductivity type semiconductor layer, respectively;
the side reflection layer covers at least a region of the substrate and the first conductivity type semiconductor layer;
the insulation layer has a region disposed between the side reflection layer and the first conductivity type semiconductor layer;
the side reflection layer contacts a region of a side surface of the substrate; and
the first bump pad electrically connects to the first pad and the second bump pad electrically connects to the second pad.

17. The light emitting device of claim 16, wherein the side reflection layer contacts a side surface of the insulation layer and the substrate.

18. The light emitting device of claim 16, further comprising a wavelength conversion layer disposed on the support.

19. The light emitting device of claim 18, wherein the wavelength conversion layer is disposed on the side reflection layer and the light emitting diode.

20. The light emitting device of claim 16, wherein the side reflection layer is disposed between the barrier and the light emitting diode.

* * * * *